US012749524B2

(12) United States Patent
Jung et al.

(10) Patent No.: US 12,749,524 B2
(45) Date of Patent: Sep. 29, 2026

(54) MEMORY DEVICES INCLUDING ROW DECODER CIRCUITS HAVING SUB-WORD LINE DRIVER CIRCUIT WITH NOR LOGIC CIRCUIT

(71) Applicant: Samsung Electronics Co., Ltd., Suwon-si (KR)

(72) Inventors: Sanghoon Jung, Suwon-si (KR); Changyoung Lee, Suwon-si (KR); Jeongdon Ihm, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/781,150

(22) Filed: Jul. 23, 2024

(65) Prior Publication Data

US 2025/0166693 A1 May 22, 2025

(30) Foreign Application Priority Data

Nov. 20, 2023 (KR) ........................ 10-2023-0161439

(51) Int. Cl.

*G11C 11/408* (2006.01)
*H03K 19/20* (2006.01)
*H10W 90/00* (2026.01)

(52) U.S. Cl.

CPC ...... *G11C 11/4087* (2013.01); *G11C 11/4085* (2013.01); *H03K 19/20* (2013.01); *H10W 90/792* (2026.01)

(58) Field of Classification Search

CPC . G11C 11/4085; G11C 11/4087; H01L 24/08; H01L 2224/08145; H03K 19/20

See application file for complete search history.

(56) References Cited

U.S. PATENT DOCUMENTS 5,706,245 A * 1/1998 Kim .......................... G11C 8/10 365/230.06
5,764,585 A * 6/1998 Matsubara ............ G11C 11/408 365/230.06

(Continued)

FOREIGN PATENT DOCUMENTS

KR 20050113303 A 12/2005
KR 100557637 B1 3/2006
KR 102109416 B1 5/2020

OTHER PUBLICATIONS

Hong, et al., "A pipelined row address decoding scheme for hierarchical word line structure DRAM," ICVC '99. 6th International Conference on VLSI and CAD (Cat. No.99EX361), Seoul, Korea (South), 1999, pp. 259-262. (Year: 1999).*

(Continued)

*Primary Examiner* — B. James Peikari
(74) *Attorney, Agent, or Firm* — Wolf, Greenfield & Sacks, P.C.

(57) ABSTRACT

A memory device includes a row decoder connected to a plurality of word lines of each of a plurality of memory blocks. The row decoder includes a main word line driver circuit commonly connected to the plurality of memory blocks and configured to generate first main word line driving signals, second main word line driving signals, and sub-word line driving signals based on row address signals, and a sub-word line driving signal connected to each of the plurality of memory blocks and configured to activate one word line from among the plurality of word lines using a NOR logic circuit to which the first main word line driving signals, the second main word line driving signals, and the sub-word line driving signals are connected.

19 Claims, 15 Drawing Sheets

(56) References Cited

U.S. PATENT DOCUMENTS

| | | | | | |
|---|---|---|---|---|---|
| 5,862,098 | A * | 1/1999 | Jeong | G11C 8/10 365/230.06 |
| 5,896,345 | A * | 4/1999 | Sohn | G11C 8/10 365/189.11 |
| 6,069,838 | A * | 5/2000 | Jeong | G11C 8/14 365/230.06 |
| 6,229,755 | B1 | 5/2001 | Oh | |
| 6,498,763 | B2 * | 12/2002 | Lee | G11C 5/025 365/230.06 |
| 7,075,852 | B2 * | 7/2006 | Dono | G11C 8/14 365/230.06 |
| 7,193,925 | B2 | 3/2007 | Hong | |
| 8,228,720 | B2 * | 7/2012 | Choi | G11C 13/0004 365/163 |
| 9,111,633 | B2 | 8/2015 | Kim | |
| 2010/0046313 | A1 * | 2/2010 | Lee | G11C 11/4085 365/230.06 |
| 2010/0202241 | A1 | 8/2010 | Park et al. | |
| 2012/0163115 | A1 * | 6/2012 | Ghosh | G11C 11/4085 365/230.06 |
| 2014/0140125 | A1 * | 5/2014 | Mae | G11C 13/0069 365/148 |
| 2016/0372172 | A1 * | 12/2016 | Shin | G11C 11/4074 |
| 2021/0327490 | A1 * | 10/2021 | Park | G11C 11/5642 |
| 2022/0406360 | A1 | 12/2022 | Lee et al. | |
| 2022/0406361 | A1 * | 12/2022 | Baek | G11C 16/08 |
| 2023/0017400 | A1 | 1/2023 | Wang | |

OTHER PUBLICATIONS

Noda et al., "A boosted dual world-line decoding scheme for 256 Mb DRAMs," 1992 Symposium on VLSI Circuits Digest of Technical Papers, Seattle, WA, USA, 1992, pp. 112-113. (Year: 1992).*

* cited by examiner

MEMORY DEVICES INCLUDING ROW DECODER CIRCUITS HAVING SUB-WORD LINE DRIVER CIRCUIT WITH NOR LOGIC CIRCUIT

CROSS-REFERENCE TO RELATED APPLICATION(S)

This application is based on and claims priority under 35 U.S.C. § 119 to Korean Patent Application No. 10-2023-0161439, filed on Nov. 20, 2023, in the Korean Intellectual Property Office, the disclosure of which is incorporated by reference herein in its entirety.

BACKGROUND

The inventive concept relates generally to semiconductor memory devices, and more particularly, to memory devices including row decoder circuits that may reduce chip size.

Recently, along with the multifunctionalization of information and communication devices, memory devices with larger capacity and higher integration are demanded. As the size of a memory cell is reduced for high integration, operating circuits and/or wiring structures included in a memory device for operation and electrical connection of the memory device are becoming more complex. There is a demand for a memory device having excellent electrical characteristics with improved integration. To improve storage capacity and integration of a memory device, instead of planar channel transistors formed on a semiconductor substrate, vertical channel transistors formed vertically on a semiconductor substrate are being introduced.

A memory device, e.g., dynamic random access memory (DRAM), includes a plurality of memory cells, each of the memory cells including a vertical channel transistor and a capacitor, and operates in a manner in which data is written and read by using electric charges stored in the capacitor. Memory cells are connected to word lines and bit lines. In DRAM, when a read operation or a refresh operation is performed, a row decoder decodes a row address to select a word line corresponding to the row address and applies a word line driving voltage of a high voltage (e.g., VPP) to a selected word line, and sense amplifiers may sense voltage levels of bit lines corresponding to a column address from among bit lines of memory cells connected to the selected word line.

The DRAM may have a cell-over-periphery (COP) structure including a cell array structure and a core peripheral circuit structure overlapping each other in a vertical direction. The cell array structure may include a memory cell array including a plurality of memory cells, each of the plurality of memory cells including vertical channel transistors and capacitors, and the core peripheral circuit structure may include peripheral circuits including a row decoder and a sense amplifier. Along with the shrinkage of a memory process, the ratio of the area occupied by a core peripheral circuit region with respect to the area occupied by a memory cell array region increases. Therefore, the chip size of DRAM having the COP structure is mainly dependent on the area occupied by the core peripheral circuit region.

To reduce the chip size of DRAM, it is necessary to reduce the area occupied by the core peripheral circuit region. When the area occupied by a row decoder is reduced, it may be beneficial to reduce the chip size of DRAM.

SUMMARY

The inventive concept, as manifested in one or more embodiments thereof, provides a memory device including a row decoder circuit associated with a plurality of memory cells including vertical channel transistors and configured to reduce the chip size of the memory device.

According to an aspect of the inventive concept, there is provided a memory device including a plurality of memory blocks including a plurality of word lines, and a row decoder connected to the plurality of word lines of each of the plurality of memory blocks, wherein the row decoder includes a main word line driver circuit commonly connected to the plurality of memory blocks and configured to generate first main word line driving signals, second main word line driving signals, and sub-word line driving signals based on row address signals, and a sub-word line driver circuit connected to each of the plurality of memory blocks and configured to activate one word line from among the plurality of word lines using a NOR logic circuit to which the first main word line driving signals, the second main word line driving signals, and the sub-word line driving signals are connected.

According to another aspect of the inventive concept, there is provided a memory device including a core peripheral circuit structure including a first bonding metal pad, and a cell array structure overlapping the core peripheral circuit structure in a vertical direction over the core peripheral circuit structure and including a second bonding metal pad in contact with the first bonding metal pad, wherein the cell array structure includes a memory cell region having a plurality of memory blocks including a plurality of word lines, wherein each of the plurality of word lines contacts the first bonding metal pads and the second bonding metal pads, respectively, the core peripheral circuit structure includes a row decoder connected to the plurality of word lines of each of the plurality of memory blocks, and the row decoder includes a main word line driver circuit configured to generate first main word line driving signals, second main word line driving signals, and sub-word line driving signals based on row address signals, and a sub-word line driver circuit configured to activate one word line from among the plurality of word lines using a NOR logic circuit to which the first main word line driving signals, the second main word line driving signals, and the sub-word line driving signals are connected.

According to another aspect of the inventive concept, there is provided a memory device including a core peripheral circuit structure including a first bonding metal pad, and a cell array structure overlapping the core peripheral circuit structure in a vertical direction over the core peripheral circuit and including a second bonding metal pad in contact with the first bonding metal pad, wherein the cell array structure includes a memory cell region having a plurality of memory blocks including a plurality of word lines, wherein each of the plurality of word lines contacts the first bonding metal pads and the second bonding metal pads, respectively, the core peripheral circuit structure includes a row decoder connected to the plurality of word lines of each of the plurality of memory blocks, the row decoder includes a sub-word line driver circuit configured to activate one word line from among the plurality of word lines, and the sub-word line driver circuit connected to each of the plurality of word lines is disposed in a region that overlaps the first bonding metal pad in a vertical direction.

BRIEF DESCRIPTION OF THE DRAWINGS

Embodiments of the inventive concept will be more clearly understood from the following detailed description taken in conjunction with the accompanying drawings, wherein like reference numerals (when used) indicate corresponding elements throughout the several views, and in which.

DETAILED DESCRIPTION

Figure 1:
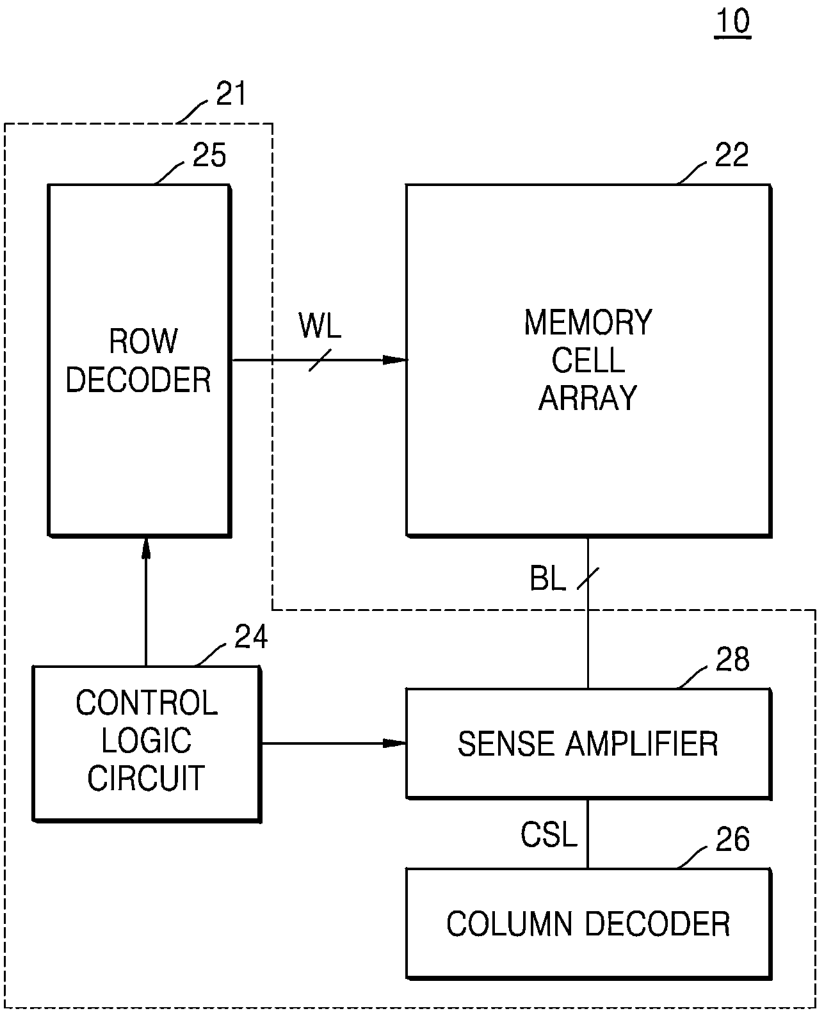
FIG. 1 is a schematic diagram conceptually showing at least a portion of an example memory device according to one or more embodiments.
Figure 2:
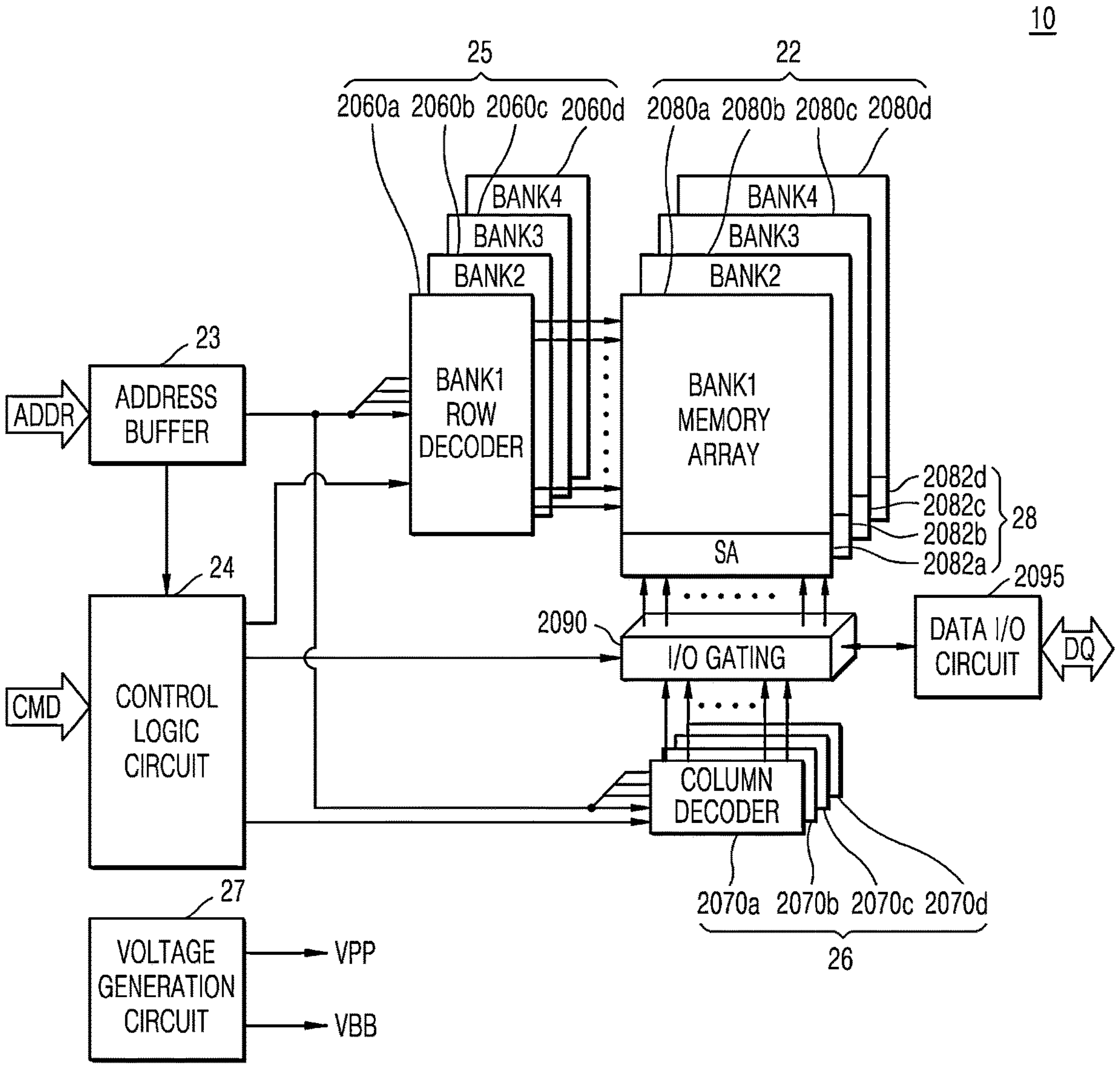
FIG. 2 is a schematic block diagram illustrating a configuration of the memory device of FIG. 1.

FIG. 1 is a schematic diagram conceptually showing a memory device 10 according to embodiments. FIG. 2 is a schematic block diagram showing a configuration of the memory device 10 of FIG. 1, according to one or more embodiments.

Referring to FIGS. 1 and 2, the memory device 10 may include a core peripheral circuit 21 and a memory cell array 22 coupled to the core peripheral circuit 21. The core peripheral circuit 21 may include a control logic circuit 24, a voltage generation circuit 27, a sense amplifier 28, a row decoder 25, and a column decoder 26. The core peripheral circuit 21 may further include an address buffer 23, an input/output gating circuit 2090, a data input/output (I/O) circuit 2095, etc. According to embodiments, the memory device 10 may be a dynamic random access memory (DRAM) including a plurality of memory cells, each of the memory cells including a vertical channel transistor and a capacitor. Hereinafter, a "memory device" will refer to a DRAM.

Figure 11:
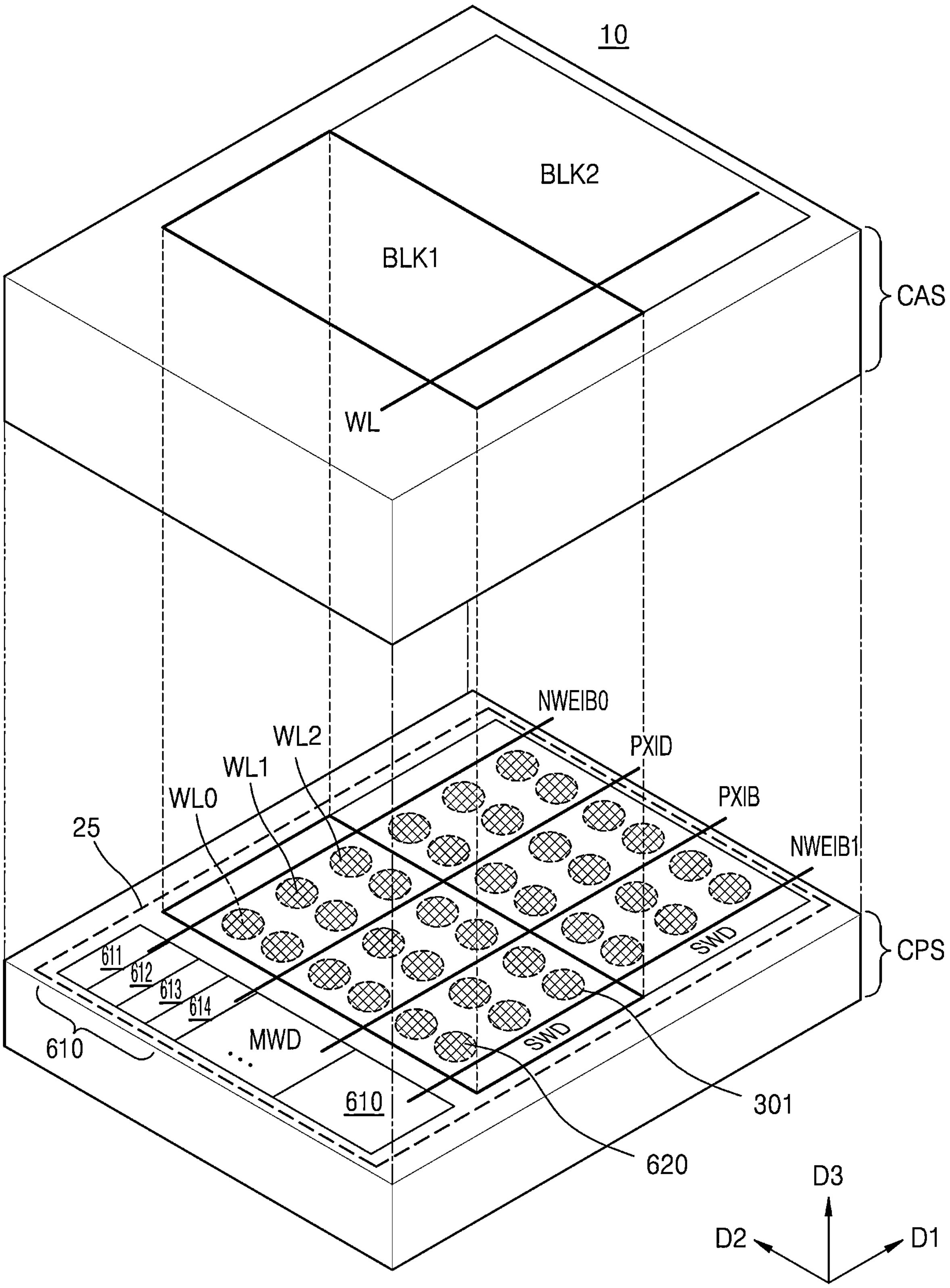
FIGS. 11, 12A, 12B, and 12C are schematic diagrams illustrating a perspective view and top plan view, respectively, of a row decoder architecture in which a row decoder is disposed in a memory device, according to one or more embodiments.

The memory cell array 22 may be connected to the row decoder 25 through word lines WL and connected to the sense amplifier 28 through bit lines BL. The term "connected" (or "connecting," or like terms such as "contact" or "contacting"), as may be used herein, is intended to refer to a physical and/or electrical connection between two or more elements, and may include other intervening elements. As used herein, the term "and/or" includes any and all combinations of one or more of the associated listed items. The memory cell array 22 may include first to fourth bank arrays 2080*a*, 2080*b*, 2080*c*, and 2080*d*, respectively, although embodiments are not limited to any specific number of bank arrays. The first to fourth bank arrays 2080*a*, 2080*b*, 2080*c*, and 2080*d* may each include a plurality of word lines WL, a plurality of bit lines BL, and a plurality of memory cells formed at points where the plurality of word lines WL and the plurality of bit lines BL cross each other and may be divided into a plurality of memory blocks BLK1 to BLKi (i is an integer equal to or greater than 2, as shown in FIG. 11).

The voltage generation circuit 27 may generate various internal voltages for driving circuits of the memory device 10. The voltage generation circuit 27 may generate, for example, a high voltage VPP, a negative voltage VBB, an internal power voltage, a bit line pre-charge voltage, a reference voltage, a bulk bias voltage, etc., by using a power voltage (e.g., VDD) applied from the outside of the memory device 10.

For example, the high voltage VPP may be provided to the row decoder 25, has a higher voltage level than the power voltage VDD, and may be used for main word line driving signal generation circuits (FIGS. 8A and 8B) and sub-word line driving signal generation circuits (FIGS. 9A and 9B) for turning on N-type metal-oxide-semiconductor (NMOS) cell transistors connected to the word lines WL. The negative voltage VBB may have a negative (−) voltage level lower than that of the power voltage VDD and may be used to increase the data retention time by raising the threshold voltage Vth of the NMOS cell transistors. The negative voltage VBB may be applied to a well region where the NMOS cell transistor is formed and may be commonly referred to as a bulk bias voltage or a back bias voltage. The bit line pre-charge voltage may be used to equalize a bit line BL and a complementary bit line before the sense amplifier 28 senses a voltage difference between the bit line BL and the complementary bit line. The internal power voltage may be provided to first and second sensing driving voltage lines of the sense amplifier 28. The sense amplifier 28 may sense and amplify the voltage difference between the bit line BL and the complementary bit line according to the first and second sensing driving voltage lines. The reference voltage may be used to compare against the voltage of a signal received from a command/address bus to determine the logic value of the signal received from a memory controller.

The row decoder 25 may include first to fourth bank row decoders 2060*a*, 2060*b*, 2060*c*, and 2060*d* respectively connected to the first to fourth bank arrays 2080*a*, 2080*b*, 2080*c*, and 2080*d*, and the column decoder 26 may include first to fourth bank column decoders 2070*a*, 2070*b*, 2070*c*, and 2070*d* respectively connected to the first to fourth bank arrays 2080*a*, 2080*b*, 2080*c*, and 2080*d*. The sense amplifier 28 may include first to fourth sense amplifiers (SA) 2082*a*, 2082*b*, 2082*c*, and 2082*d* respectively connected to the first to fourth bank arrays 2080*a*, 2080*b*, 2080*c*, and 2080*d*.

The first to fourth bank arrays 2080*a*, 2080*b*, 2080*c*, and 2080*d*, the first to fourth bank row decoders 2060*a*, 2060*b*, 2060*c*, and 2060*d*, the first to fourth bank column decoders 2070*a*, 2070*b*, 2070*c*, and 2070*d*, and the first to fourth sense amplifiers 2082*a*, 2082*b*, 2082*c*, and 2082*d*, may constitute first to fourth banks, respectively, of the memory device 10. The first to fourth bank row decoders 2060*a*, 2060*b*, 2060*c*, and 2060*d*, the first to fourth bank column decoders 2070*a*, 2070*b*, 2070*c*, and 2070*d*, and the first to fourth sense amplifiers 2082*a*, 2082*b*, 2082*c*, and 2082*d*, may be referred to as core circuits of the first to fourth banks BANK1 to BANK4, respectively. Although an example of the memory device 10 including four banks is illustrated in the present embodiment, according to some embodiments, the memory device 10 may include other numbers of banks.

The address buffer 23 may receive an address ADDR including a row address (e.g., RA<0:8>, FIGS. 8A and 9A) and a column address from a memory controller connected to the memory device 10. Also, the address buffer 23 may receive a bank address and provide the bank address to a bank control logic, provide a received row address RA<0:8> to the row decoder 25, and provide a received column address to the column decoder 26. The bank control logic may generate bank control signals in response to a bank address. In response to bank control signals, a bank row decoder corresponding to a bank address from among the first to fourth bank row decoders 2060_a_, 2060_b_, 2060_c_, and 2060_d_ may be activated and a bank column decoder corresponding to the bank address from among the first to fourth bank column decoders 2070_a_, 2070_b_, 2070_c_, and 2070_d_ may be activated.

The control logic circuit 24 may control the overall operation of the memory device 10. The control logic circuit 24 may generate control signals to perform a write operation and/or a read operation of the memory device 10. The control logic circuit 24 may include a mode register for setting a plurality of operational options of the memory device 10 and a command decoder for decoding a command CMD signal received from the memory controller.

The sense amplifier 28 may sense data stored in a memory cell and transmit sensed data to the data input/output circuit 2095 to output the sensed data to the memory controller through a data pad(s). The data input/output circuit 2095 may receive data to be written in memory cells from the memory controller through the data pad(s) and transmit the data to the memory cell array 22. The input/output gating circuit 2090 may output read data using a data line amplifier that receives and amplifies data sensed by the sense amplifier 28. Read data may be output to the memory controller through a data pad(s). The input/output gating circuit 2090 may include, together with circuits for gating input/output data DQ, a column selecting circuit, an input data mask logic, read data latches for storing data output from the first to fourth bank arrays 2080_a_, 2080_b_, 2080_c_, and 2080_d_, and a write driver for writing data to the first to fourth bank arrays 2080_a_, 2080_b_, 2080_c_, and 2080_d_.

Read data output from one bank array from among the first to fourth bank arrays 2080_a_, 2080_b_, 2080_c_, and 2080_d_ may be sensed by the first to fourth sense amplifiers 2082_a_, 2082_b_, 2082_c_, and 2082_d_ corresponding to the one bank array and stored in the read data latches. Write data to be written to a memory cell array of one of the first to fourth bank arrays 2080_a_, 2080_b_, 2080_c_, and 2080_d_ may be provided from the memory controller to the data input/output circuit 2095. Data provided to the data input/output circuit 2095 may be written to one bank array through the write driver.

Figure 3:
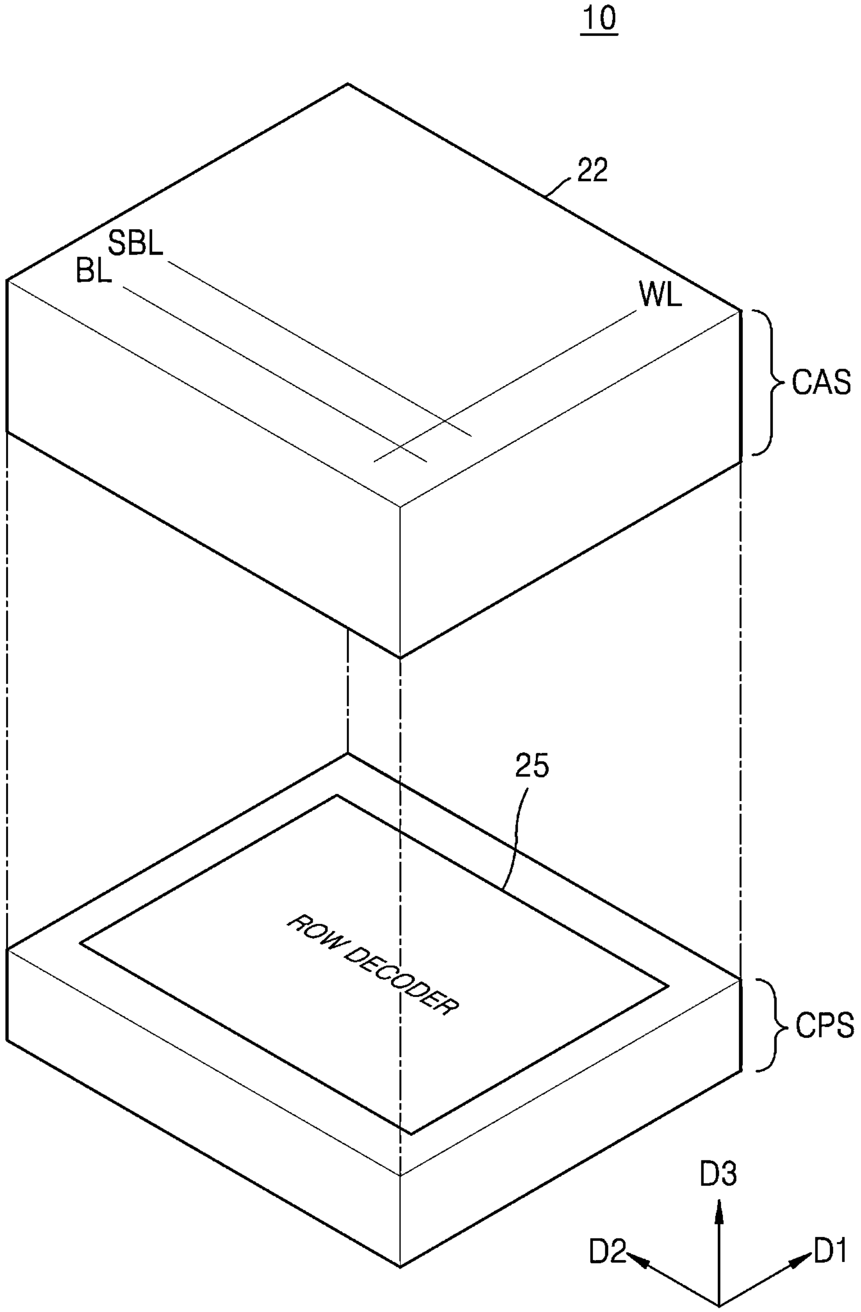
FIGS. 3, 4, 5, and 6 are schematic diagrams illustrating a structure of a memory device according to one or more embodiments.
Figure 4:
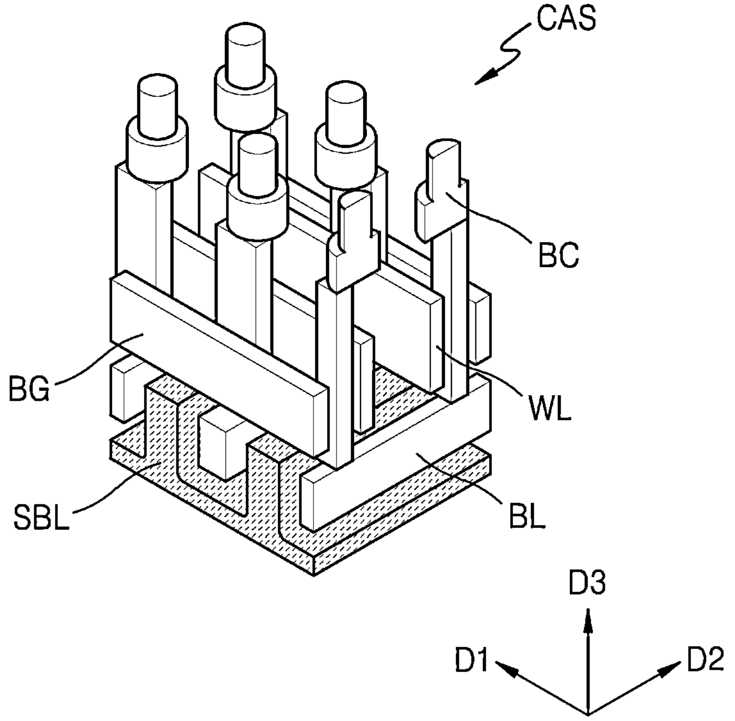
Figure 5:
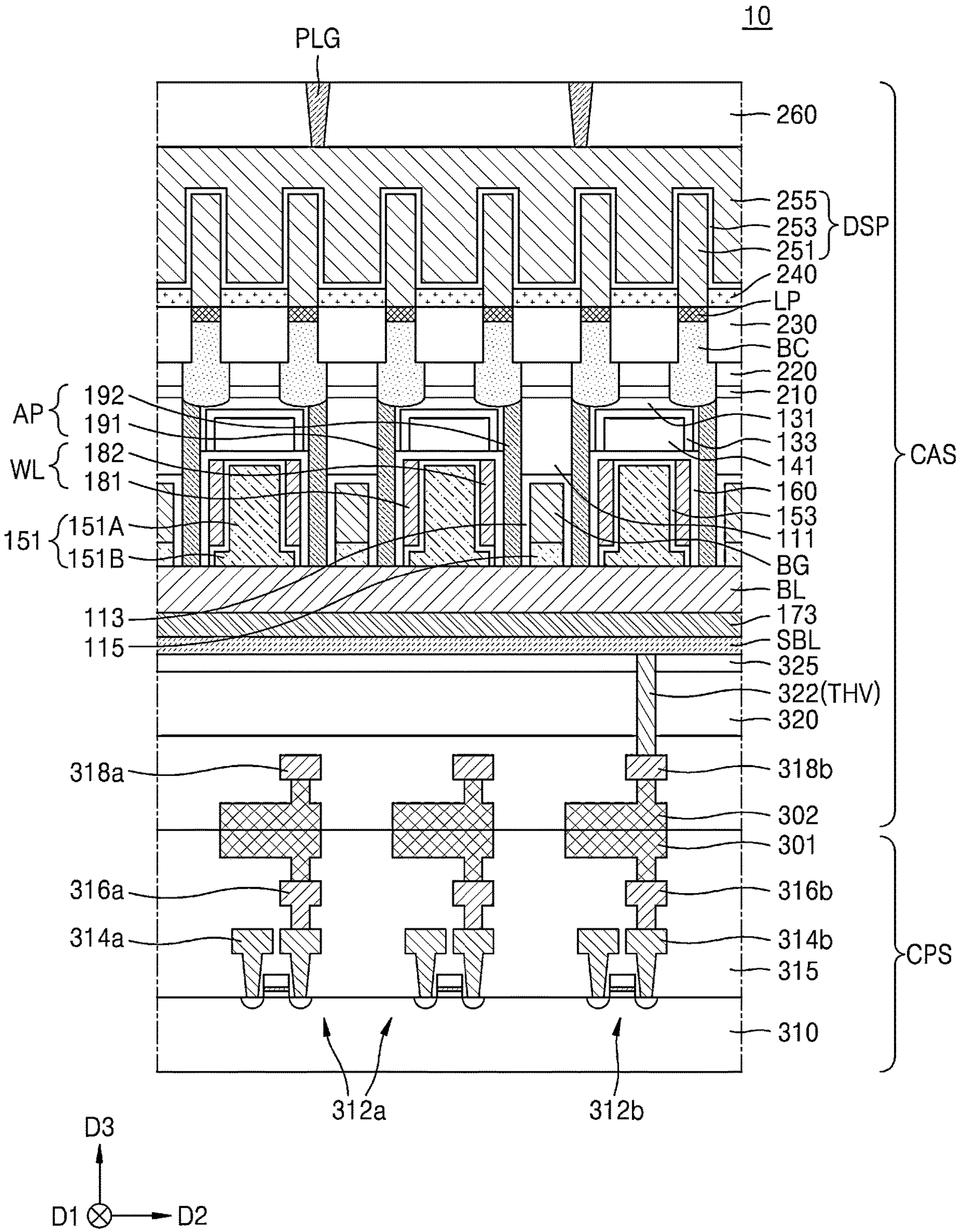
Figure 6:
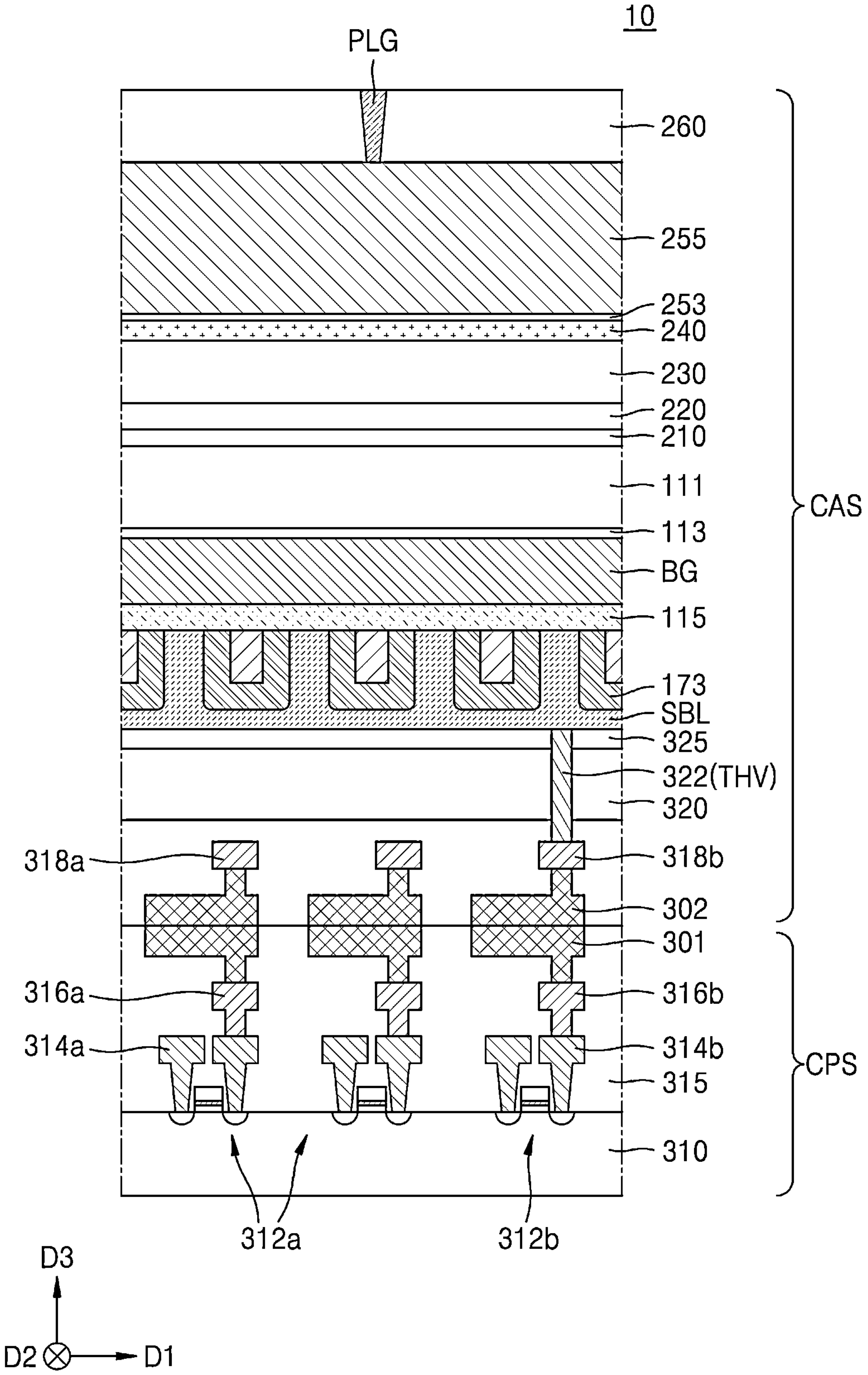

FIGS. 3, 4, 5, and 6 are schematic diagrams illustrating the structure of a memory device according to embodiments. FIG. 3 is a perspective view depicting an example arrangement of a cell array structure CAS and a core peripheral circuit structure CPS of the memory device 10, according to one or more embodiments. FIG. 4 is a perspective view of a cell array structure CAS of the memory device 10 of FIG. 3. FIG. 5 is a cross-sectional view cut in the second direction D2 in the perspective view of the memory device 10 of FIG. 4, and FIG. 6 is a cross-sectional view cut in the first direction D1 in the perspective view of the memory device 10 of FIG. 4. For convenience of understanding, terms such as top surface/bottom surface, top/bottom, above/below, etc. are used based on directions shown in the drawings referred to. Accordingly, even the same surface may be referred to as a top surface or a bottom surface according to the directions shown in the drawings.

Referring to FIGS. 2 and 3, the memory device 10 may include the cell array structure CAS and the core peripheral circuit structure CPS that overlap each other in a third direction D3. The term "overlap" (or "overlapping," or like terms), as may be used herein, is intended to broadly refer to a first element that intersects with at least a portion of a second element in the vertical direction (i.e., the third direction D3), but does not require that the first and second elements be completely aligned with one another in a horizontal plane (i.e., in a first direction D1 and/or a second direction D2). The cell array structure CAS may include the memory cell array 22. The core peripheral circuit structure CPS may include core peripheral circuits including the address buffer 23, the control logic circuit 24, the row decoder 25, the column decoder 26, the sense amplifier 28, the input/output gating circuit 2090, and the data input/output circuit 2095. For the brevity of description, it is illustrated that circuits constituting the row decoder 25 are arranged in the core peripheral circuit structure CPS. The memory device 10 may have a structure in which the memory cell array 22 is disposed above a core peripheral circuit, that is, a cell-over-periphery (COP) structure.

The cell array structure CAS may include a plurality of memory cells including a vertical channel transistor (VCT). In the cell array structure CAS, the plurality of word lines WL may extend in the first direction D1, parallel to an upper surface of the cell array structure CAS, and the plurality of bit lines BL may extend in the second direction D2 parallel to an upper surface of the cell array structure CAS and intersecting the first direction D1. Shielding bit lines SBL may be arranged adjacent to the plurality of bit lines BL.

The core peripheral circuit structure CPS may include a semiconductor substrate, and the core peripheral circuit may be formed by forming semiconductor devices such as transistors and patterns for distributing devices on the semiconductor substrate. After the core peripheral circuit is formed in the core peripheral circuit structure CPS, the cell array structure CAS including the memory cell array 22 may be formed, and patterns (e.g., bonding metal pads 301 and 302 of FIG. 5) for electrically connecting the word lines WL, the bit lines BL, and the shielding bit lines SBL of the memory cell array 22 to the core peripheral circuit formed in the core peripheral circuit structure CPS may be formed.

Referring to FIGS. 4, 5, and 6 together, the core peripheral circuit structure CPS may include a lower substrate 310, an interlayer insulation layer 315, a plurality of circuit elements 312_a_ and 312_b_ formed on the lower substrate 310, first metal layers 314_a_ and 314_b_ respectively connected to the plurality of circuit elements 312_a_ and 312_b_, second metal layers 316_a_ and 316_b_ respectively formed on the first metal layers 314_a_ and 314_b_, and a bonding metal pad 301 formed on the uppermost metal layer of the core peripheral circuit structure CPS. According to an embodiment, the first metal layers 314_a_ and 314_b_ may include tungsten having relatively high resistance, the second metal layers 316_a_ and 316_b_ may include copper having relatively low resistance, and the bonding metal pad 301 may include copper, although embodiments are not limited thereto. According to another embodiment, the bonding metal pad 301 may include aluminum (Al) or tungsten (W).

Although only the first metal layers 314_a_ and 314_b_ and the second metal layers 316_a_ and 316_b_ are shown and described in the present specification, the inventive concept is not limited thereto, and one or more metal layers may be further formed on the second metal layers 316_a_ and 316_b_. At least some of the one or more metal layers formed on the second metal layers 316_a_ and 316_b_ may include a material such as aluminum having a lower resistance than copper constituting the second metal layers 316_a_ and 316_b_. The interlayer insulation layer 315 is disposed on the lower substrate 310 to cover the plurality of circuit elements 312_a_ and 312_b_, the first metal layers 314_a_ and 314_b_, and the second metal layers 316_a_ and 316_b_ and may include an insulation material such as, for example, a silicon oxide or a silicon nitride. The term "cover" (or "covering," "covers," or like terms), as may be used herein, is intended to broadly refer to an element, structure or layer that is on or over another element, structure or layer, either directly or with one or more other intervening elements, structures or layers therebetween.

The plurality of circuit elements 312*a* and 312*b* may be connected to at least one of the circuit elements constituting the peripheral circuit. For convenience of explanation, first circuit elements 312*a* represent transistors constituting the row decoder 25, and second circuit elements 312*b* represent transistors constituting the control logic circuit 24.

In the memory device 10, the bit lines BL may be arranged on an upper substrate 320 in the cell array structure CAS, extending in the second direction D2 and spaced apart from each other in the first direction D1. The upper substrate 320 is shown as a component corresponding to the lower substrate 310. According to one or more embodiments, the upper substrate 320 may be referred to as a plate or a conductive plate. The bit lines BL may be spaced apart from each other in the first direction D1 and extend in the second direction D2 that intersects with the first direction D1. Active patterns AP may be alternately arranged in the second direction D2 on each bit line BL. The active patterns AP may be spaced apart from each other at regular intervals in the first direction D1. In other words, the active patterns AP may be 2-dimensionally arranged in the first direction D1 and the second direction D2 that intersect with each other. According to some embodiments, the plurality of word lines WL, the plurality of bit lines BL, and a plurality of active patterns AP constitute a plurality of vertical channel transistors.

The active patterns AP may each have a length in the first direction D1, a width in the second direction D2, and a height in the third direction D3 perpendicular to the upper substrate 320. The active patterns AP may each have a substantially uniform width. The active patterns AP may each have a top surface and a bottom surface facing each other in the third direction D3. For example, the bottom surface of the active patterns AP may contact the bit line BL. The active patterns AP may each include a source region adjacent to the bit line BL, a drain region adjacent to a contact pattern BC, and a channel region between the source region and the drain region. The channel region of the active patterns AP may be controlled by the word lines WL and back gate electrodes BG when the memory device 10 operates. The active patterns AP may include, for example, monocrystalline silicon (Si) to improve leakage current characteristics during operation of the memory device 10.

The back gate electrodes BG may be spaced apart from one another at regular intervals in the second direction D2 on the bit lines BL. The back gate electrodes BG may extend in the first direction D1 across the bit lines BL. The back gate electrodes BG may each be disposed between the active patterns AP adjacent to each other in the second direction D2. A first active pattern 191 may be disposed on one side of each of the back gate electrodes BG, and a second active pattern 192 may be disposed on the other side of each of the back gate electrodes BG. The back gate electrodes BG may have a height that is less than the height of the active patterns AP in the vertical direction (i.e., the third direction D3). A negative voltage may be applied to the back gate electrodes BG during operation of the memory device 10 and may increase the threshold voltage of a vertical channel transistor. This means that deterioration of the leakage current characteristics due to a lower threshold voltage based on miniaturization of a vertical channel transistor may be prevented or reduced.

A first insulation pattern 111 may be disposed between the active patterns AP adjacent to each other in the second direction D2. The first insulation pattern 111 may extend in the first direction D1 in parallel with the back gate electrodes BG. A back gate insulation layer 113 may be disposed between each back gate electrode BG and the active patterns AP and between the back gate electrode BG and the first insulation pattern 111. The back gate insulation layer 113 may include vertical portions covering both sides of the back gate electrode BG and a horizontal portion interconnecting the vertical portions. The horizontal portion of the back gate insulation layer 113 may be closer to the contact pattern BC than to the bit line BL and may cover the bottom surface of the back gate electrode BG. A back gate capping pattern 115 may be disposed between the bit lines BL and the back gate electrode BG. The back gate capping pattern 115 may include an insulation material, and the bottom surface of the back gate capping pattern 115 may be in contact with the bit lines BL. The back gate capping pattern 115 may be disposed between the vertical portions of the back gate insulation layer 113.

The word lines WL may extend in the first direction D1 on the bit lines BL and may be alternately arranged in the second direction D2. A first word line 181 of the word lines WL may be disposed on one side of the first active pattern 191, and a second word line 182 of the word lines WL may be disposed on the other side of the second active pattern 192. Portions of first word lines 181 may be arranged between first active patterns 191 adjacent to each other in the first direction D1, and portions of second word lines 182 may be arranged between second active patterns 192 adjacent to each other in the first direction D1.

The word lines WL may be vertically spaced apart from the bit lines BL and contact patterns BC. The word lines WL may be located between the bit lines BL and the contact patterns BC when viewed in a vertical direction. The word lines WL adjacent to each other may have sidewalls facing each other. The word lines WL may have a height that is less than the height of the active patterns AP in the vertical direction, relative to an upper surface of the upper substrate 320 as a reference layer. The height of the word lines WL may be equal to or greater than the height of the back gate electrodes BG in the third direction D3, relative to the upper surface of the upper substrate 320.

Gate insulation layers 160 may be arranged between the word lines WL and the active patterns AP. The gate insulation layers 160 may extend in the first direction D1 in parallel to the word lines WL. A gate insulation layer 160 may cover one side surface of the first active pattern 191 and the other side surface of the second active pattern 192. The gate insulation layer 160 may have a substantially uniform thickness. A second insulation pattern 141 may be disposed between the gate insulation layer 160 and the contact patterns BC. For example, the second insulation pattern 141 may include silicon oxide. A first etch stop layer 131 and a second etch stop layer 133 may be arranged between the active patterns AP and the second insulation pattern 141.

On the gate insulation layer 160, the word lines WL may be separated from each other by a third insulation pattern 151. The third insulation pattern 151 may extend in the first direction D1 between the word lines WL. A first capping layer 153 may be disposed between the third insulation pattern 151 and the word lines WL. The first capping layer 153 may have a substantially uniform thickness. The third insulation pattern 151 may include a third vertical pattern 151A and a third horizontal pattern 151B.

The contact patterns BC may penetrate through (i.e., extend into) a third etch stop layer 210 and an interlayer insulation layer 220 and be electrically connected to the active patterns AP, respectively. In other words, the contact patterns BC may be electrically connected to drain regions of the active patterns AP, respectively. The contact patterns BC may each have a lower width that is greater than an upper width. The contact patterns BC adjacent to each other may be separated from each other by separation insulation patterns 230. The contact patterns BC may each have any of various shapes, such as a circular shape, an elliptical shape, a rectangular shape, a square shape, a rhombus shape, a hexagonal shape, etc., when viewed from above (i.e., in plan view). Landing pads LP may be arranged on the contact patterns BC.

The separation insulation patterns 230 may be arranged between the landing pads LP. The landing pads LP may be arranged in a matrix-like form in the first direction D1 and the second direction D2, when viewed from above. The top surfaces of the landing pads LP may be substantially coplanar with the top surfaces of the separation insulation patterns 230 in the third direction D3. A fourth etch stop layer 240 may be formed on the separation insulation patterns 230.

Data storage patterns DSP may be arranged on the landing pads LP. The data storage patterns DSP may be electrically connected to the active patterns AP, respectively. The data storage patterns DSP may be arranged in a matrix-like form in the first direction D1 and the second direction D2. The data storage patterns DSP may completely or partially overlap the landing pads LP. The data storage patterns DSP may contact the entire top surfaces of the landing pads LP or portions of the top surfaces of the landing pads LP. An upper insulation layer 260 may be disposed on the data storage patterns DSP, and cell contact plugs PLG may penetrate through the upper insulation layer 260 and be electrically connected to a plate electrode 255.

According to some embodiments, the data storage patterns DSP may be capacitors and may include a capacitor dielectric layer 253 provided between storage electrodes 251 and the plate electrode 255. In this case, the storage electrode 251 may be in direct contact with the landing pad LP, and the storage electrode 251 may have any of various shapes, such as a circular shape, an elliptical shape, a rectangular shape, a square shape, a rhombus shape, a hexagonal shape, etc., when viewed from above.

According to some embodiments, the data storage patterns DSP may be variable resistance patterns that may be switched between two resistance states by an electrical pulse applied to a memory element. For example, data storage patterns DSP may include phase-change materials of which the crystal state changes depending on the amount of a current, perovskite compounds, transition metal oxides, magnetic materials, ferromagnetic materials, antiferromagnetic materials, etc., but are not limited thereto. According to a material layer constituting the data storage patterns DSP, the memory device 10 may be implemented as a resistive memory, such as phase change RAM (PRAM), magnetic RAM (MRAM), or resistive RAM (RRAM).

In one or more embodiments, a shielding bit line SBL may be disposed between the bit lines BL and under the bit lines BL. The shielding bit line SBL may reduce coupling noise between bit lines BL adjacent to each other. For example, the shielding bit line SBL may be a shielding structure including a conductive material. First line insulation layers 173 may be spaced apart from each other in the first direction D1 and extend in the second direction D2. The first line insulation layers 173 may be formed to contact opposing sidewalls of neighboring bit lines BL and be separated from each other in the first direction D1. A second line insulation layer 325 may be formed to surround the bottom surface and the side surfaces of the shielding bit line SBL and fill the space between shielding bit line(s) SBL. The term "surround" (or "surrounding" or like terms, such as "enclose"), as may be used herein, is intended to broadly refer to an element, structure or layer that extends around, envelops, encircles, or encloses another element, structure or layer on all sides, although breaks or gaps may also be present. The term "fill" (or "fills," or like terms), as may be used herein, is intended to refer broadly to either completely filling a defined space (e.g., the space between shielding bit lines SBL) or partially filling the defined space; that is, the defined space need not be entirely filled but may, for example, be partially filled or have voids or other spaces throughout.

A via electrode 322 (e.g., through-hole via (THV)) may penetrate through (i.e., extend into) the upper substrate 320, contact a metal layer 318*b*, and extend in the third direction D3 to a bonding metal pad 302 formed on the uppermost metal layer of the core peripheral circuit structure CPS. In the present embodiment, only one metal layer 318*a* or 318*b* is shown and described. However, the inventive concept is not limited thereto, and at least one more metal layer may be further formed on the metal layer 318*a* or 318*b*. The shielding bit line SBL may be electrically connected to an element 312*b* of the control logic circuit 24 through the bonding metal pad 302 of the cell array structure CAS and the bonding metal pad 301 of the core peripheral circuit structure CPS. The shielding bit line SBL may be controlled by the control logic circuit 24.

According to some embodiments, the bonding metal pad 302 of the cell array structure CAS and the bonding metal pad 301 of the core peripheral circuit structure CPS may be connected to each other through an electrical or physical bonding method. When bonding metal pads 301 and 302 include copper (Cu), the bonding method may be a Cu—Cu bonding method. In another example, the bonding metal pads 301 and 302 may include aluminum (Al) or tungsten (W).

The metal layer 318*a* of the cell array structure CAS may be electrically or physically connected to each of the word lines WL and may be in contact with the bonding metal pad 301. The word lines WL may each be electrically connected to an element 312*a* of the row decoder 25 through the bonding metal pad 302 of the cell array structure CAS and the bonding metal pad 301 of the core peripheral circuit structure CPS. Hereinafter, components and operations of the row decoder 25 connected to the word lines WL are described in detail through various embodiments.

Figure 7:
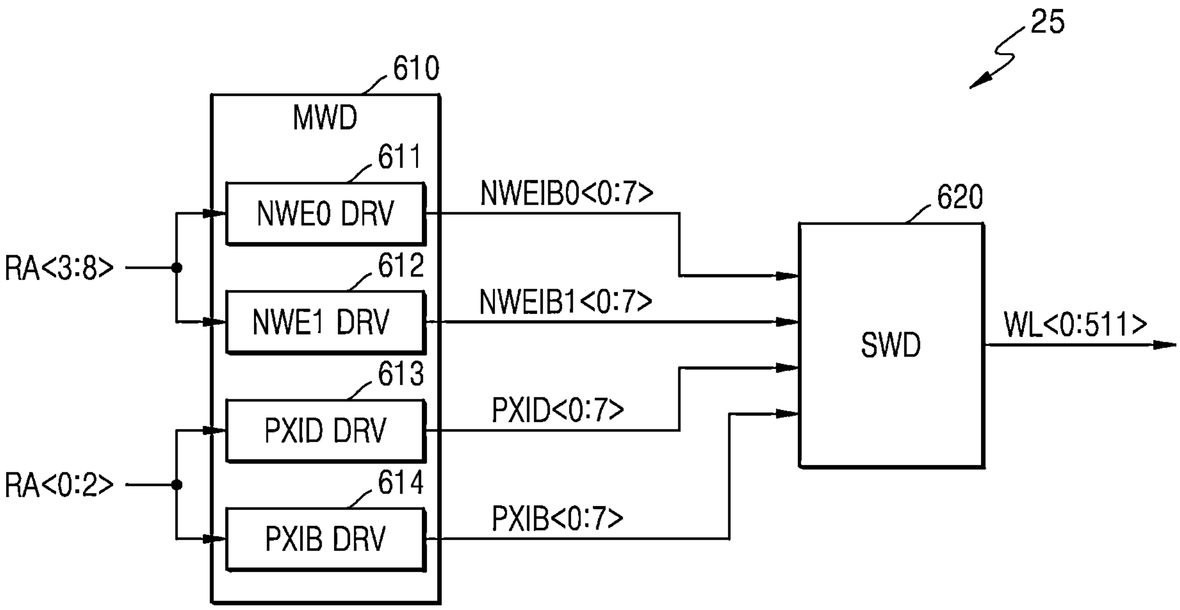
FIG. 7 is a schematic block diagram illustrating a row decoder according to one or more embodiments.
Figure 8A:
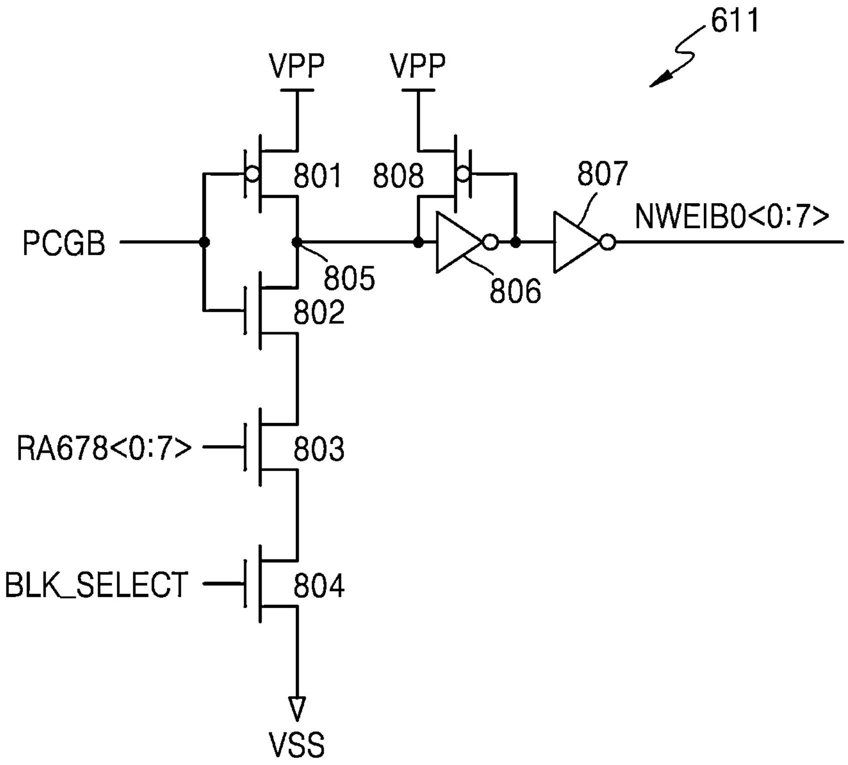
FIGS. 8A, 8B, 9A, and 9B are schematic circuit diagrams illustrating a main word line driver circuit of FIG. 7.
Figure 8B:
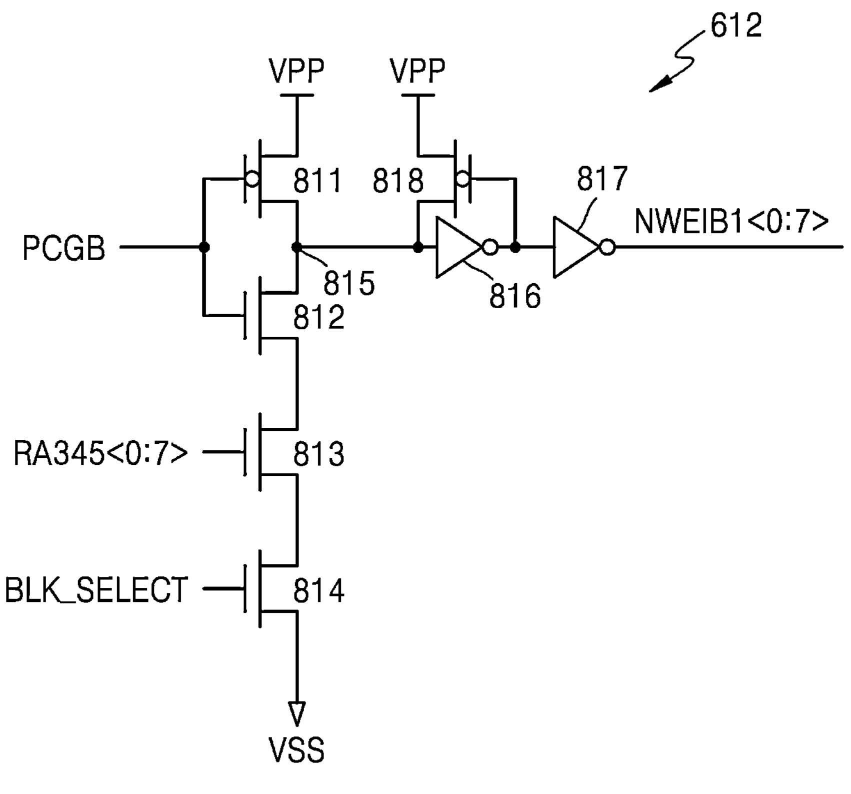
Figure 9A:
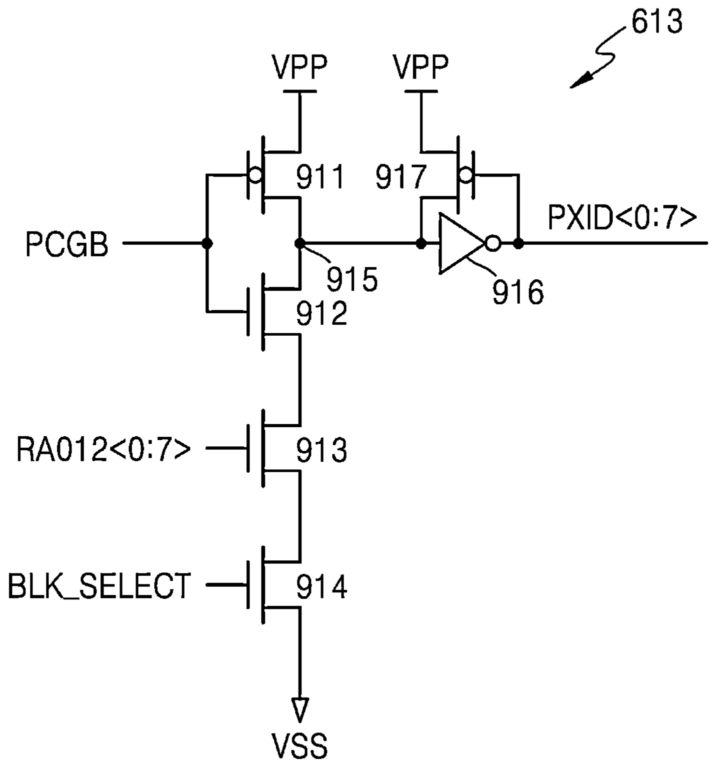
Figure 9B:
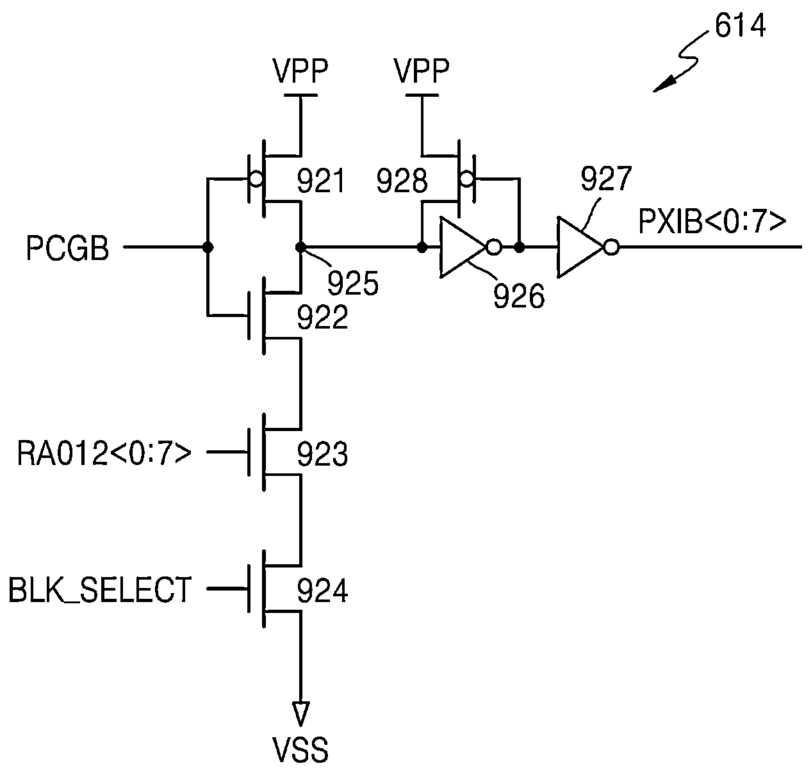
Figure 10:
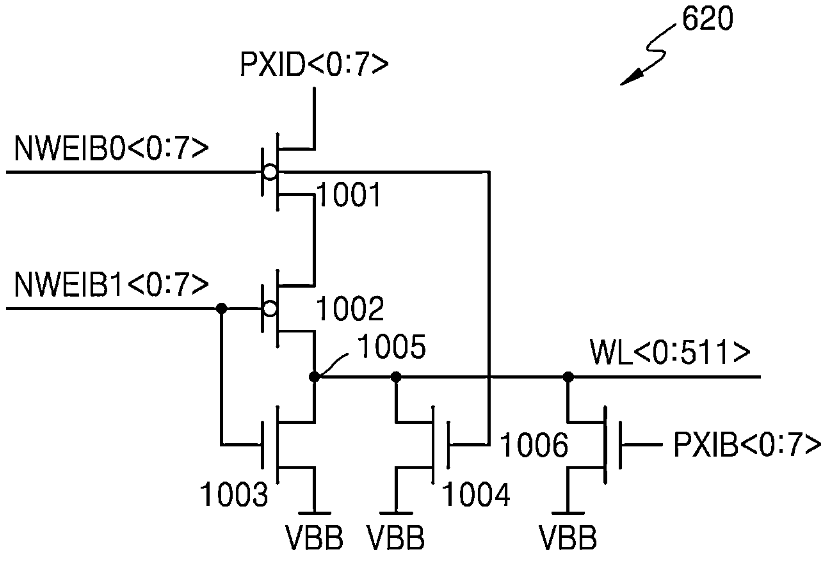
FIG. 10 is a schematic circuit diagram illustrating a sub-word line driver circuit in the row decoder of FIG. 7.

FIGS. 7, 8A, 8B, 9A, 9B, and 10 are schematic diagrams illustrating a row decoder according to embodiments. FIG. 7 is a block diagram illustrating the row decoder 25 of FIG. 1. FIGS. 8A, 8B, 9A, and 9B are circuit diagrams illustrating example embodiments of a main word line driver circuit 610 of FIG. 7. FIG. 10 is a circuit diagram illustrating an example embodiment of a sub-word line driver circuit 620 of FIG. 7.

Referring to FIG. 7, the row decoder 25 may select a word line WL corresponding to a row address RA with respect to a bank (e.g., the first bank BANK1) selected from among the first to fourth banks BANK1 to BANK4 of FIG. 2. The row decoder 25 shown in FIG. 7 indicates the first bank row decoder 2060*a*, which is connected to the first bank BANK1, from among the first to fourth bank row decoders 2060*a*, 2060*b*, 2060*c*, and 2060*d* of FIG. 2.

In embodiments below, for convenience of explanation, the first to fourth banks BANK1, BANK2, BANK3, and BANK4 may each include the row decoder 25, and the row decoder 25 may select at least one of a plurality of memory blocks BLK1 to BLKi by decoding a row address and select the word line WL of the selected memory block. According to the present embodiment, although it is described that each of the plurality of memory blocks BLK1 to BLKi includes 512 word lines according to a 9-row address RA<0:8> signal configuration, the inventive concept is not limited thereto, and other numbers of word lines and corresponding row addresses may be included. For example, the plurality of memory blocks BLK1 to BLKi may each include 1024 or 2048 word lines according toa 10-row address RA<0:9> signal configuration or an 11-row address RA<0:10> signal configuration.

The row decoder 25 may include the main word line driver (MWD) circuit 610 and the sub-word line driver (SWD) circuit 620. According to some embodiments, the first to fourth banks BANK1, BANK2, BANK3, and BANK4 may each include a plurality of memory blocks BLK1 to BLKi, wherein i is an integer equal to or greater than 2. The main word line driver circuit 610 may be commonly connected to the memory blocks BLK1 to BLKi, and the sub-word line driver circuit 620 may be connected to each of the memory blocks BLK1 to BLKi.

The main word line driver circuit 610 may include first and second main word line driving signal generation circuits 611 and 612 and first and second sub-word line driving signal generation circuits 613 and 614. The main word line driver circuit 610 may generate a first main word line driving signal NWEIB0<0:7> and a second main word line driving signal NWEIB1<0:7> based on signals of a most significant bit (MSB) group from among row address RA<0:8> signals. From among the row address RA<0:8> signals, signals of the MSB group may be set to RA<3:8> row addresses. The RA<3:8> row addresses may include RA<6:8> row addresses corresponding to a most significant bit group (hereinafter referred to as "RA678" row addresses) and RA<3:5> row addresses corresponding to a least significant bit group (hereinafter referred to as "RA345" row addresses).

According to some embodiments, a first main word line driving signal generation circuit 611 may generate a first main word line driving signal NWEIB0<0:7> by decoding the RA678 row addresses, and a second main word line driving signal generation circuit 612 may generate a second main word line driving signal NWEIB1<0:7> by decoding the RA345 row addresses. An example in which the main word line driver circuit 610 according to the present embodiment divides MSB signals RA<3:8> of the row address RA<0:8> signals into two groups (e.g., RA678, RA345) and generates eight first main word line driving signals NWEIB0<0:7> and eight second main word line driving signals NWEIB0<0:7> based on them is described. According to other embodiments, the main word line driver circuit 610 may change decoding for generating a plurality of main word line driving signals NWEIBn-1 (n is a natural number) based on the number of bits (e.g., 5, 6, or 7) of MSB group signals from among row address signals according to the configuration (i.e., the number of word lines; e.g., 1024, 2048, etc.) of each of the plurality of first to fourth banks BANK1, BANK2, BANK3, and BANK4.

Referring to FIG. 8A, the first main word line driving signal generation circuit 611 may include first to fourth transistors 801 to 804 connected in series between a line of a high voltage VPP and a line of a ground voltage VSS, include first and second inverters 806 and 807 connected in series to connection nodes 805 of first and second transistors 801 and 802, and include a fifth transistor 808 connected between the line of the high voltage VPP and the connection nodes 805 of the first and second transistors 801 and 802. The first to fourth transistors 801 to 804 may constitute a NAND logic circuit of some sort. The first transistor 801 may be configured as a P-type metal-oxide-semiconductor (PMOS) transistor to which a pre-charge signal PCGB is connected to a gate thereof, and a second transistor 802 may be configured as an NMOS transistor to which the pre-charge signal PCGB is connected to a gate thereof.

According to some embodiments, the pre-charge signal PCGB is provided based on a pre-charge command by the control logic circuit 24 and may serve as a signal to activate the row decoder 25. The row decoder 25 may be activated by a logic high level pre-charge signal PCGB, and the row decoder 25 may be deactivated by a logic low level pre-charge signal PCGB.

The third transistor 803 may be configured as an NMOS transistor to which a decoded RA678<0:7> row address signal is provided (i.e., connected) to a gate thereof, and a fourth transistor 804 may be configured as an NMOS transistor to which a block select signal BLK_SELECT is provided to a gate thereof. The block select signal BLK_SELECT may be provided to select one memory block from among the plurality of memory blocks BLK1 to BLKi. For example, a logic high level first block select signal may be provided to select the first memory block BLK1. The first and second inverters 806 and 807 connected in series to the connection nodes 805 of the first and second transistors 801 and 802 may output the first main word line driving signal NWEIB0<0:7>. The fifth transistor 808 may include a PMOS transistor of which the gate is connected to the output of the first inverter 806 and may be referred to as a keeper transistor that stably maintains the output of the first inverter 806.

Eight first main word line driving signal generation circuits 611 each outputting the first main word line driving signal NWEIB0<0:7> in response to the decoded RA678<0:7> row address signal may be provided. Since the configuration of the decoded RA678<0:7> row address signal has eight cases (i.e., 000, 001, 010, 011, 100, 101, 110, and 111), the first main word line driving signal NWEIB0<0:7> to be activated may also have eight configurations. In other words, according to the decoded RA678<0:7> row address signal, any one of NWEIB0<0>, NWEIB0<1>, NWEIB0<2>, NWEIB0<3>, NWEIB0<4>, NWEIB0<5>, NWEIB0<6>, and NWEIB0<7> may be activated to a logic low level. The first main word line driving signal NWEIB0<0:7> at a logic low level may have the voltage level of the ground voltage VSS level and may be provided to the sub-word line driver circuit 620 connected to each of the memory blocks BLK1 to BLKi.

Referring to FIG. 8B, the second main word line driving signal generation circuit 612 may include first to fourth transistors 811 to 814 connected in series between a line of the high voltage VPP and a line of the ground voltage VSS, include first and second inverters 816 and 817 connected in series to connection nodes 815 of first and second transistors 811 and 812, and include a fifth transistor 818 connected between the line of the high voltage VPP and the connection nodes 815 of the first and second transistors 811 and 812. The first to fourth transistors 811 to 814 may constitute a NAND logic circuit of some sort. The second main word line driving signal generation circuit 612 has the same configuration as the first main word line driving signal generation circuit 611 of FIG. 8A, except that a decoded RA345<0:7> row address signal is connected to a gate of the third transistor 813 and the second inverter 817 outputs the second main word line driving signal NWEIB1<0:7>.

Eight second main word line driving signal generation circuits 612 each outputting the second main word line driving signal NWEIB1<0:7> in response to the decoded RA345<0:7> row address signal may be provided. Since the configuration of the decoded RA345<0:7> row address signal has eight cases (i.e., 000, 001, 010, 011, 100, 101, 110, and 111), the second main word line driving signal NWEIB1<0:7> to be activated may also have eight configurations. In other words, according to the decoded RA345<0:7> row address signal, any one of NWEIB1<0>, NWEIB1<1>, NWEIB1<2>, NWEIB1<3>, NWEIB1<4>, NWEIB1<5>, NWEIB1<6>, and NWEIB1<7> may be activated to a logic low level. The second main word line driving signal NWEIB1<0:7> at a logic low level may have the voltage level of the ground voltage VSS level and may be provided to the sub-word line driver circuit 620 connected to each of the memory blocks BLK1 to BLKi.

The main word line driver circuit 610 of FIG. 7 may generate a first sub-word line driving signal PXID<0:7> and a second sub-word line driving signal PXIB<0:7> based on signals of a least significant bit (LSB) group from among row address RA<0:8> signals. From among the row address RA<0:8> signals, signals of the LSB group may be set to RA<0:2> row addresses (hereinafter referred to as "RA012"). The main word line driver circuit 610 may include a first sub-word line driving signal generation circuit 613 for generating the first sub-word line driving signal PXID<0:7> by decoding the RA012 row addresses and a second sub-word line driving signal generation circuit 614 for generating the second sub-word line driving signal PXIB<0:7> by decoding the RA012 row addresses.

Although an example in which the main word line driver circuit 610 according to the present embodiment generates eight first sub-word line driving signals PXID<0:7> and eight second sub-word line driving signals PXIB<0:7> based on LSB signals RA<0:2> of the row address RA<0:8> signals is described, it is just an example to aid understanding and is not intended to limit the inventive concept. According to other embodiments, the main word line driver circuit 610 may change decoding for generating a plurality of sub-word line driving signals PXIDj and PXIBk (j and k are natural numbers) based on the number of bits (e.g., 3, 4, or 5) of LSB group signals from among row address signals according to the configuration (i.e., the number of word lines; e.g., 2048, 4096, etc.) of each of the plurality of memory blocks BLK1 to BLKi.

Referring to FIG. 9A, the first sub-word line driving signal generation circuit 613 may include first to fourth transistors 911 to 914 connected in series between a line of the high voltage VPP and a line of the ground voltage VSS, include an inverter 916 connected to connection nodes 915 of the first and second transistors 911 and 912, and include a fifth transistor 917 connected between the line of the high voltage VPP and the connection nodes 915 of the first and second transistors 911 and 912. The first to fourth transistors 911 to 914 may constitute an NAND logic circuit of some sort. The first transistor 911 may be configured as a PMOS transistor to which the pre-charge signal PCGB is connected to a gate thereof, and the second transistor 912 may be configured as an NMOS transistor to which the pre-charge signal PCGB is connected to a gate thereof. The third transistor 913 may be configured as an NMOS transistor to which a decoded RA012<0:7> row address signal is connected to a gate thereof, and the fourth transistor 914 may be configured as an NMOS transistor to which the block select signal BLK_SELECT is connected to a gate thereof. The inverter 916 may output the first sub-word line driving signal PXID<0:7>. The fifth transistor 917 may include a PMOS transistor of which the gate is connected to the output of the inverter 916 and may be referred to as a keeper transistor that stably maintains the output of the inverter 916.

Eight first sub-word line driving signal generation circuits 613 each outputting the first sub-word line driving signal PXID<0:7> in response to the decoded RA012<0:7> row address signal may be provided. Since the configuration of the decoded RA012<0:7> row address signal has eight cases (i.e., 000, 001, 010, 011, 100, 101, 110, and 111), the first sub-word line driving signal PXID<0:7> to be activated may also have eight configurations. In other words, any one of first main word driving signals PXID0<0>, PXID0<1>, PXID0<2>, PXID0<3>, PXID0<4>, PXID0<5>, PXID0<6> and PXID0<7> may be activated to a logic high level according to the decoded RA012<0:7> row address signals. The first sub-word line driving signal PXID<0:7> at a logic low level may have the voltage level of the high voltage VPP and may be provided to the sub-word line driver circuit 620 connected to each of the memory blocks BLK1 to BLKi.

Referring to FIG. 9B, the second sub-word line driving signal generation circuit 614 may include first to fourth transistors 921 to 924 connected in series between a line of the high voltage VPP and a line of the ground voltage VSS, include first and second inverters 926 and 927 connected in series to connection nodes 925 of first and second transistors 921 and 922, and include a fifth transistor 928 connected between the line of the high voltage VPP and the connection nodes 925 of the first and second transistors 921 and 922. The first to fourth transistors 921 to 924 may constitute a NAND logic circuit of some sort. The second sub-word line driving signal generation circuit 614 has the same configuration as the second sub-word line driving signal generation circuit 613 of FIG. 9A, except that the first and second inverters 926 and 927 connected in series to the connection nodes 925 of the first and second transistors 921 and 922 output a second sub-word line driving signal PXIB<0:7>. The first sub-word line driving signal PXID<0:7> and the second sub-word line driving signal PXIB<0:7> have logic levels opposite to each other (i.e., complementary outputs).

Eight second sub-word line driving signal generation circuits 614 each outputting the second sub-word line driving signal PXIB<0:7> in response to the decoded RA012<0:7> row address signal may be provided. Since the configuration of the decoded RA012<0:7> row address signal has eight cases (i.e., 000, 001, 010, 011, 100, 101, 110, and 111), the second sub-word line driving signal PXIB<0:7> to be activated may also have eight configurations. In other words, any one of first main word driving signals PXIB0<0>, PXIB0<1>, PXIB0<2>, PXIB0<3>, PXIB0<4>, PXIB0<5>, PXIB0<6> and PXIB0<7> may be activated to a logic low level according to the decoded RA012<0:7> row address signals. The second sub-word line driving signal PXIB<0:7> at a logic low level may have the voltage level of the ground voltage VSS and may be provided to the sub-word line driver circuit 620 connected to each of the memory blocks BLK1 to BLKi.

As shown in FIG. 11, the main word line driver circuit 610 may include eight first main word line driving signal generation circuits 611, eight second main word line driving signal generation circuits 612, eight first sub-word line driving signal generation circuits 613, and eight second sub-word line driving signal generation circuits 614. The main word line driver circuit 610 may be disposed in the peripheral circuit structure CPS, and first and second main word line driving signals NWEIB0<0:7> and NWEIB1<0:7> output from the main word line driver circuit 610 and first and second sub-word line driving signals PXID<0:7> and PXIB<0:7> may be commonly connected to the memory blocks BLK1 to BLKi.

Referring to FIG. 10, the sub-word line driver circuit 620 may include first to fifth transistors 1001, 1002, 1003, 1004, and 1006. The first and second transistors 1001 and 1002 may be connected in series between the line of the first sub-word line driving signal PXID<0:7> and connection nodes 1005 of the second to fourth transistors 1002 to 1004, the first main word line driving signal NWEIB0<0:7> may be connected to a gate of the first transistor 1001, and the second main word line driving signal NWEIB1<0:7> may be connected to a gate of the second transistor 1002. The third transistor 1003 and the fourth transistor 1004 may be connected in parallel between the connection nodes 1005 of the second to fourth transistors 1002 to 1004 and the line of the negative voltage VBB, the second main word line driving signal NWEIB1<0:7> may be connected to a gate of the third transistor 1003, and the first main word line driving signal NWEIB0<0:7> may be connected to a gate of the fourth transistor 1004. The fifth transistor 1006 may be configured as an NMOS transistor, in which a line of the negative voltage VBB is connected to a source of the fifth transistor 1006, the connection nodes 1005 of the second to fourth transistors 1002 to 1004 are connected to a drain of the fifth transistor 1006, and the second sub-word line driving signal PXIB<0:7> is applied to a gate of the fifth transistor 1006. The connection nodes 1005 of the second to fourth transistors 1002 to 1004 may be connected to word lines WL<0:511> of the memory blocks BLK1 to BLKi. First to fourth transistors 1001 to 1004 of the sub-word line driver circuit 620 may be implemented as a NOR logic circuit.

The sub-word line driver circuit 620 may be disposed in portions of the peripheral circuit structure PCS respectively corresponding to the memory blocks BLK1 to BLKi. 512 sub-word line driver circuits 620 may be provided to be respectively connected to the word lines WL<0:511> in response to the first main word line driving signal NWEIB0<0:7>, the second main word line driving signal NWEIB1<0:7>, the first sub-word line driving signal PXID<0:7>, and the second sub-word line driving signal PXIB<0:7>. The sub-word line driver circuit 620 may select any one of 512 word lines WL<0:511> in response to a logic low level of the activated first main word line driving signal NWEIB0<0:7>, a logic low level of the activated second main word line driving signal NWEIB1<0:7>, a logic high level of the activated first sub-word line driving signal PXID<0:7>, and a logic low level of the activated second sub-word line driving signal PXIB<0:7> and may activate a selected word line to a logic high level. A word line selected from among the word lines WL<0:511> may be activated to the level of the high voltage VPP of the first sub-word line driving signal PXID<0:7> of the logic high level.

Figure 12:
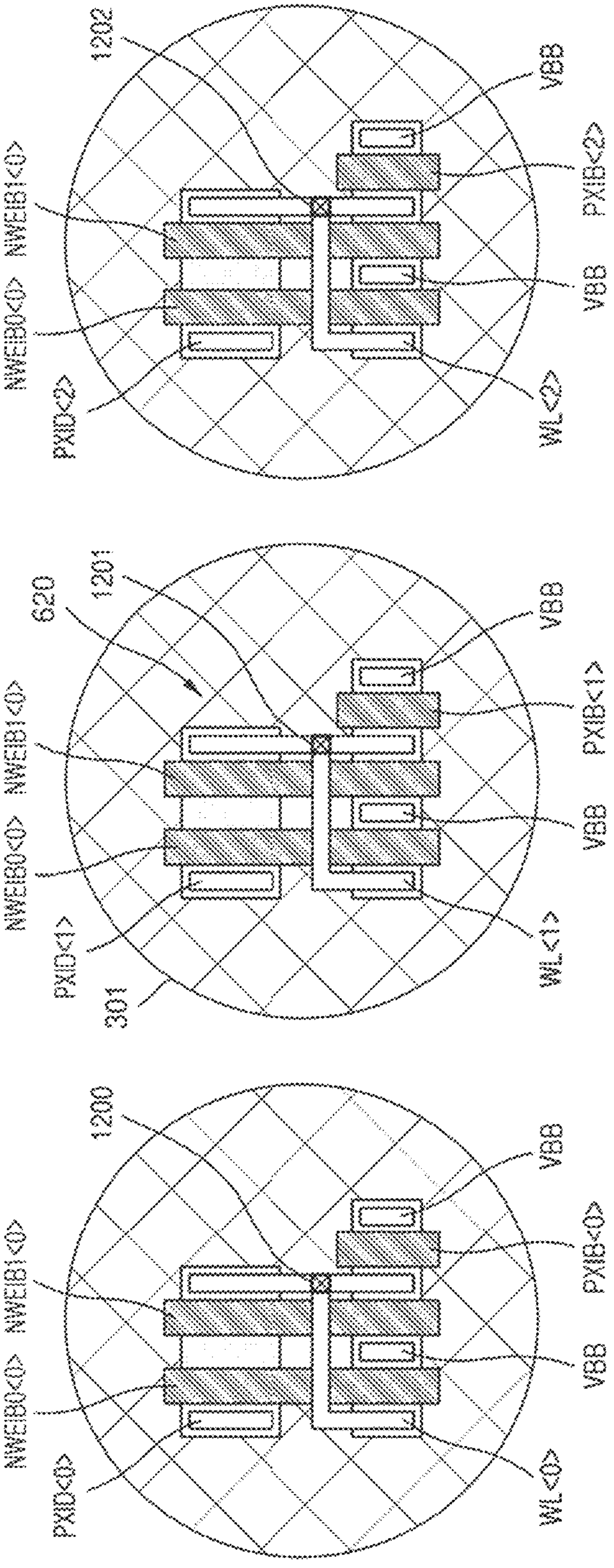

FIGS. 11, 12A, 12B, and 12C are diagrams illustrating a row decoder architecture in which a row decoder is disposed in a memory device, according to one or more embodiments. For brevity of the drawing, FIG. 11 is a perspective view showing the first memory block BLK1 and the second memory block BLK2 among the plurality of memory blocks BLK1 to BLKi included in the first to fourth banks BANK1, BANK2, BANK3, and BANK4 of FIG. 2. FIGS. 12A, 12B, and 12C show the bonding metal pads 301 and the sub-word line driver circuit 620 associated with each of first to third word lines WL<0>, WL<1>, and WL<2> from among the plurality of word lines WL<0:511>.

Referring to FIG. 11 in conjunction with FIGS. 7, 8A, 8B, 9A, 9B, and 10, the memory device 10 may include the cell array structure CAS and the core peripheral circuit structure CPS that overlap each other in the third direction D3. The cell array structure CAS may include a first memory block BLK1 region and a second memory block BLK2 region. The core peripheral circuit structure CPS may include a main word line driver circuit 610 region commonly connected to first and second memory blocks BLK1 and BLK2 and a sub-word line driver circuit 620 region connected to each of the first and second memory blocks BLK1 and BLK2.

The main word line driver circuit 610 region may include eight first main word line driving signal generation circuits 611 for respectively generating first main word line driving signals NWEIB0<0:7> (indicated as "NWEIB0"), eight second main word line driving signal generation circuits 612 for respectively generating second main word line driving signals NWEIB1<0:7> (indicated as "NWEIB1"), eight first sub-word line driving signal generation circuits 613 for respectively generating the first sub-word line driving signal PXID<0:7> (indicated as "PXID"), and eight second sub-word line driving signal generation circuits 614 for respectively generating the second sub-word line driving signal PXIB<0:7> (indicated as "PXIB"). Lines of the first main word line driving signals NWEIB0<0:7>, lines of the second main word line driving signals NWEIB1<0:7>, lines of the first sub-word line driving signals PXID<0:7>, and lines of the second sub-word line driving signals PXIB<0:7> may be provided to the sub-word line driver circuit 620 region.

The sub-word line driver circuit 620 region may include 512 sub-word line driver circuits 620 and 512 bonding metal pads 301 respectively connected to the word lines WL<0:511>. The 512 sub-word line driver circuits 620 and 512 bonding metal pads 301 may be divided to correspond to word lines of the first and second memory blocks BLK1 and BLK2, respectively. According to an embodiment, the first to third word lines WL<0>, WL<1>, and WL<2> may be included in the first memory block BLK1.

Referring to FIGS. 10, 12A, 12B, and 12C, sub-word line driver circuits 620 respectively connected to the first to third word lines WL<0>, WL<1>, and WL<2> may be arranged in a bonding metal pad 301 region. The sub-word line driver circuit 620 connected to a first word line WL<0> may be disposed, such that the first and second transistors 1001 and 1002 respectively connected to the line of a first main word line driving signal NWEIB0<0> and the line of a second main word line driving signal NWEIB1<0> are connected in series between the line of a first sub-word line driving signal PXID<0> and the first word line WL<0>. Also, the sub-word line driver circuit 620 connected to the first word line WL<0> may be disposed, such that third to fifth transistors 1003, 1004, and 1006 respectively connected to the line of the first main word line driving signal NWEIB0<0>, the line of the second main word line driving signal NWEIB1<0:7>, and the line of a second sub-word line driving signal PXIB<0> are connected in parallel between the first word line WL<0> and the line of the negative voltage VBB. The first word line WL<0> may be connected to the bonding metal pad 301 through a metal contact 1200.

The sub-word line driver circuit 620 connected to a second word line WL<1> may be disposed, such that the first and second transistors 1001 and 1002 respectively connected to the line of a first main word line driving signal NWEIB0<0> and the line of a second main word line driving signal NWEIB1<0> are connected in series between the line of a second sub-word line driving signal PXID<1> and the first word line WL<0>. Also, the sub-word line driver circuit 620 connected to the second word line WL<1> may be disposed, such that third to fifth transistors 1003, 1004, and 1006 respectively connected to the line of the first main word line driving signal NWEIB0<0>, the line of the second main word line driving signal NWEIB1<0:7>, and the line of a second sub-word line driving signal PXIB<1> are connected in parallel between the second word line WL<1> and the line of the negative voltage VBB. The second word line WL<1> may be connected to the bonding metal pad 301 through a metal contact 1201.

The sub-word line driver circuit 620 connected to a third word line WL<2> may be disposed, such that the first and second transistors 1001 and 1002 respectively connected to the line of a first main word line driving signal NWEIB0<0> and the line of a second main word line driving signal NWEIB1<0> are connected in series between the line of a first (second?) sub-word line driving signal PXID<1> and the first word line WL<0>. Also, the sub-word line driver circuit 620 connected to the third word line WL<2> may be disposed, such that third to fifth transistors 1003, 1004, and 1006 respectively connected to the line of the first main word line driving signal NWEIB0<0>, the line of the second main word line driving signal NWEIB1<0:7>, and the line of a second sub-word line driving signal PXIB<1> are connected in parallel between the second word line WL<1> and the line of the negative voltage VBB. The third word line WL<2> may be connected to the bonding metal pad 301 through a metal contact 1202.

According to some embodiments, lines of the first main word line driving signals NWEIB0<0:7>, lines of the second main word line driving signals NWEIB1<0:7>, lines of the first sub-word line driving signals PXID<0:7>, and lines of the second sub-word line driving signals PXIB<0:7> provided in the main word line driver circuit 610 region may be arranged at regular intervals and extend to the sub-word line driver circuit 620 region. Also, the sub-word line driver circuit 620 having a NOR logic circuit configured to be connected to the lines of the first main word line driving signal NWEIB0<0:7>, the lines of the second main word line driving signal NWEIB1<0>, the lines of the first sub-word line driving signal PXID<0:7>, and the lines of the second sub-word line driving signal PXIB<0:7> may be arranged in bonding metal pads 301 regions respectively connected to the word lines WL<0:511>. It means that the area occupied by the row decoder 25 may be reduced by uniformly arranging wires connected to circuits constituting the row decoder 25. Therefore, the chip size of the memory device 10 may be reduced and the circuit operation delay time (i.e., latency) of the row decoder 25 may be reduced, thereby improving the operating performance of the memory device 10.

Figure 13:
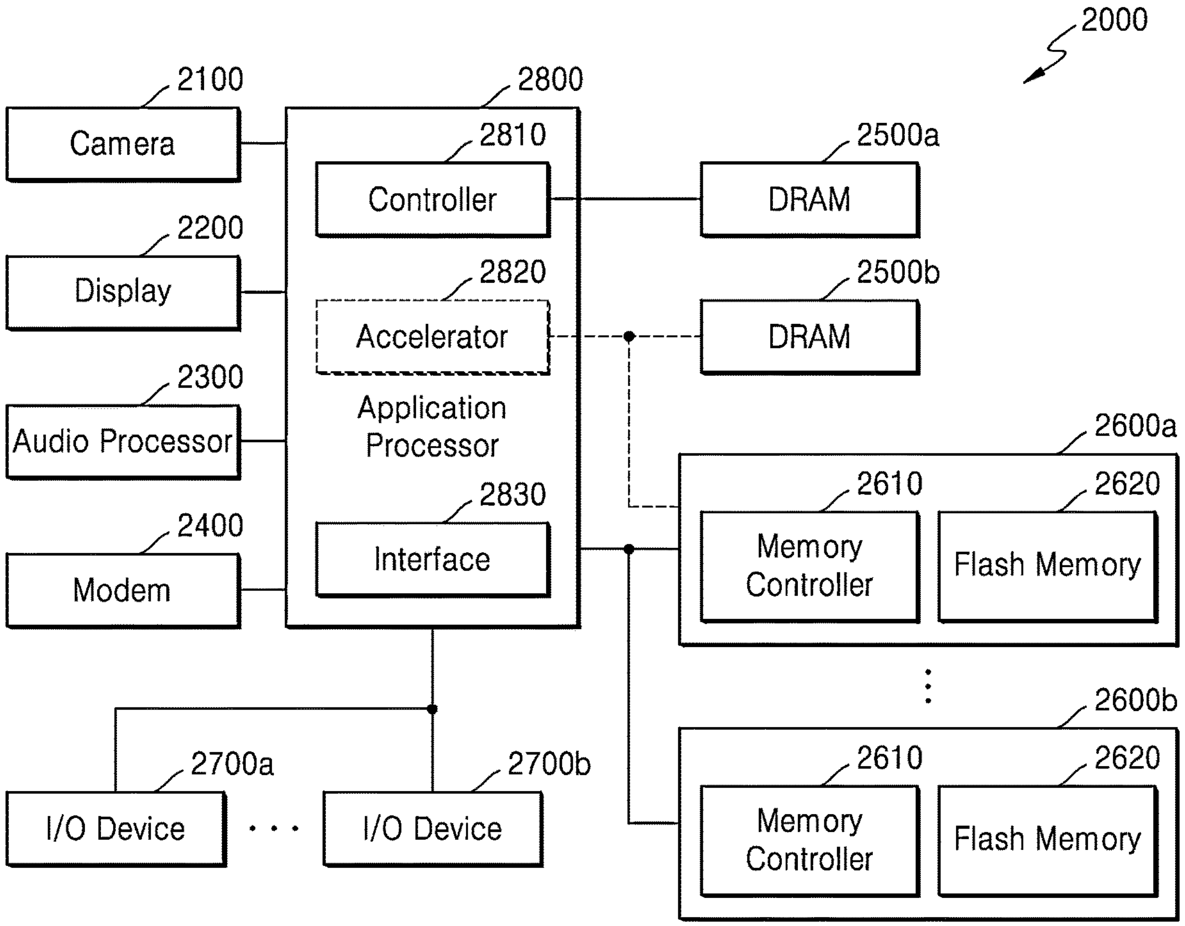
FIG. 13 is a schematic block diagram of an example system illustrating an electronic device including a memory device, according to one or more embodiments.

FIG. 13 is a schematic block diagram of a system 2000 illustrating an electronic device including a memory device according to one or more embodiments.

Referring to FIG. 13, the system 2000 may include a camera 2100, a display 2200, an audio processor 2300, a modem 2400, DRAMs 2500*a* and 2500*b*, flash memories 2600*a* and 2600*b*, input/output (I/O) devices 2700*a* and 2700*b*, and an application processor (AP) 2800. The system 2000 may be implemented as a laptop computer, a mobile phone, a smartphone, a tablet PC, a wearable device, a healthcare device, or an Internet of Things (IoT) device. Also, the system 2000 may be implemented as a server or a PC.

The camera 2100 may capture a still image or a video according to a user's control and may store captured image/video data or transmit the captured image/video data to the display 2200. The audio processor 2300 may process audio data included in the flash memories 2600*a* and 2600*b* or network content. The modem 2400 may transmit a modulated signal for wired/wireless data transmission/reception to a receiver and the modulated signal may be demodulated by the receiver to restore an original signal. The I/O devices 2700*a* and 2700*b* may include devices providing a digital input function and/or digital output function, e.g., a Universal Serial Bus (USB), a storage device, a digital camera, a Secure Digital (SD) card, a Digital Versatile Disc (DVD), a network adapter, a touch screen, etc.

The AP 2800 may control the overall operation of the system 2000. The AP 2800 may include a controller block 2810, an accelerator block or accelerator chip 2820, and an interface block 2830. The AP 2800 may control the display 2200, such that a part of content stored in the flash memories 2600*a* and 2600*b* is displayed on the display 2200. When a user input is received through the I/O devices 2700*a* and 2700*b*, the AP 2800 may perform a control operation corresponding to the user input. The AP 2800 may include an accelerator block, which is a circuit dedicated for calculation of Artificial Intelligence (AI) or other data, or may include an accelerator chip 2820 separately from the AP 2800. The DRAM 2500*b* may be additionally provided in the accelerator block or the accelerator chip 2820. The accelerator block is a functional block that specializes in performing a particular function of the AP 2800 and may include a graphics processing unit (GPU), which is a functional block that specializes in processing graphic data, a neural processing unit (NPU), which is a block that specializes in AI calculation and inference, and a data processing unit (DPU), which is a block that specializes in data transmission.

The system 2000 may include a plurality of DRAMs 2500*a* and 2500*b*. The AP 2800 may set up a DRAM interface protocol and communicate with the DRAMs 2500*a* and 2500*b* to control the DRAMs 2500*a* and 2500*b* through commands complying with the Joint Electron Device Engineering Council (JEDEC) standard and mode register (MRS) setting or to use company-specific functions such as low voltage/high-speed/reliability and a cyclic redundancy check (CRC)/error correction code (ECC) function. For example, the AP 2800 may communicate with the DRAM 2500*a* through an interface complying with the JEDEC standards such as LPDDR4 and LPDDR5, and the accelerator block or the accelerator chip 2820 may set and use a new DRAM interface protocol to control the DRAM 2500*b* for an accelerator, which has a greater bandwidth than the DRAM 2500*a*.

Although FIG. 13 shows only the DRAMs 2500*a* and 2500*b*, the inventive concept is not limited thereto. As long as a bandwidth, a response speed, and voltage conditions of the AP 2800 or the accelerator chip 2820 are satisfied, any memory like a phase-change random-access memory (PRAM), a static random-access memory (SRAM), a magnetic random-access memory (MRAM), a resistive random-access memory (RRAM), a ferroelectric random-access memory (FRAM), or a Hybrid RAM may be used. The DRAMs 2500*a* and 2500*b* have relatively smaller latency and bandwidth than the I/O devices 2700*a* and 2700*b* or the flash memories 2600*a* and 2600*b*. The DRAMs 2500*a* and 2500*b* are initialized when the system 2000 is powered on and the OS and application data are loaded thereto, and thus the DRAMs 2500*a* and 2500*b* may be used as temporary storages for the OS and the application data or may be used as execution spaces for various software code.

In the DRAMs 2500*a* and 2500*b*, four arithmetic operations (i.e., addition, subtraction, multiplication, and division), vector calculations, address calculations, or Fast Fourier Transform (FFT) calculations may be performed. Also, in the DRAMs 2500*a* and 2500*b*, a function for an operation used for an inference may be performed. Here, the inference may be performed in a deep learning algorithm using an artificial neural network. The deep learning algorithm may include a training operation for learning a model through various data and an inference operation for recognizing data with the trained model. According to an embodiment, an image captured by a user through the camera 2100 is signal-processed and stored in the DRAM 2500*b*, and the accelerator block or accelerator chip 2820 may perform AI data calculation for recognizing data using data stored in the DRAM 2500*b* and a function used for inference.

The system 2000 may include a plurality of storage devices or flash memories 2600*a* and 2600*b* having a larger capacity than the DRAMs 2500*a* and 2500*b*. The accelerator block or accelerator chip 2820 may perform a training operation and an AI data calculation using the flash memories 2600*a* and 2600*b*. According to an embodiment, the flash memories 2600*a* and 2600*b* may include a memory controller 2610 and a flash memory device 2620, and a training operation and an inference AI data calculation performed by the AP 2800 and/or the accelerator chip 2820 may be performed more efficiently by using an arithmetic unit included in the memory controller 2610. The flash memories 2600*a* and 2600*b* may store images captured through the camera 2100 or data transmitted through a data network. For example, the flash memories 2600*a* and 2600*b* may store Augmented Reality/Virtual Reality content, High Definition (HD) content, or Ultra High Definition (UHD) content.

In the system 2000, the DRAMs 2500*a* and 2500*b* may include the memory device described above with reference to FIGS. 1 to 12C. The memory device may include a peripheral circuit structure formed on a semiconductor substrate and a cell array structure vertically overlapping the peripheral circuit structure on the peripheral circuit structure. The cell array structure may include a plurality of memory blocks in a memory cell region in which a plurality of vertical channel transistor structures and a plurality of capacitor structures respectively connected to the vertical channel transistor structures are formed. The core peripheral circuit structure may include a row decoder connected to a plurality of word lines of each of the plurality of memory blocks, and the row decoder may include a main word line driver circuit commonly connected to the plurality of memory blocks and a sub-word line driver circuit 620 connected to each of the plurality of memory blocks. The main word line driver circuit may generate first main word line driving signals based on some signals of a MSB group from among row address signals, generate second main word line driving signals based on the remaining signals of the MSB group from among the row address signals, and generate first and second sub-word line driving signals having opposite logic levels based on signals of an LSB group from among the row address signals. The sub-word line driver circuit may include first and second PMOS transistors connected in series to line of each of the first sub-word line driving signals and first to third NMOS transistors connected in parallel to a line of a negative voltage of the memory device, each of the first main word line driving signals may be connected to a gate of the first PMOS transistor, each of the second main word line driving signals may be connected to a gate of the second PMOS transistor, each of the first main word line driving signals may be connected to a gate of a first NMOS transistor, each of the second main word line driving signals may be connected to a gate of a second NMOS transistor, and each of the first sub-word line driving signals may be connected to a gate of a third NMOS transistor. First and second PMOS transistors and first and second NMOS transistors of the sub-word line driver circuit may constitute a NOR logic circuit, and a plurality of word lines may be respectively connected to connection nodes of the second PMOS transistor and first to third NMOS transistors. A sub-word line driver circuit may be disposed in a region that overlaps in the vertical direction with a bonding metal pad that is in electrical contact with each of the plurality of word lines. In a memory device, as a row decoder circuit and wires connected to the row decoder circuit at uniform intervals are arranged in a circuit core peripheral circuit structure and a sub-word line driver circuit of a row decoder circuit are arranged in a bonding metal pad region, the area occupied by the row driver circuit may be reduced, thereby reducing the chip size of the memory device. Also, the operation delay time of the row decoder circuit is reduced, thereby improving the operation performance of the memory device.

While the inventive concept has been particularly shown and described with reference to embodiments thereof, it will be understood that various changes in form and details may be made therein without departing from the spirit and scope of the following claims.

What is claimed is:

1. A memory device, comprising:
- a plurality of memory blocks comprising a plurality of word lines; and
- a row decoder electrically connected to the plurality of word lines of each of the plurality of memory blocks, wherein the row decoder comprises:
- a main word line driver circuit commonly electrically connected to the plurality of memory blocks and configured to generate first main word line driving signals, second main word line driving signals, and sub-word line driving signals based on row address signals; and
- a sub-word line driver circuit electrically connected to each of the plurality of memory blocks and configured to activate one word line from among the plurality of word lines using a NOR logic circuit to which the first main word line driving signals, the second main word line driving signals, and the sub-word line driving signals are electrically connected, wherein the main word line driver circuit comprises:
- a first main word line driving signal generation circuit configured to generate the first main word line driving signals based on a subset of signals of a most significant bit group from among the row address signals;
- a second main word line driving signal generation circuit configured to generate the second main word line driving signals based on remaining signals, not included in the subset of signals, of the most significant bit group from among the row address signals; and
- a first sub-word line driving signal generation circuit and a second sub-word line driving signal generation circuit configured to generate first sub-word line driving signals and second sub-word line driving signals, respectively, based on remaining signals of a least significant bit group from among the row address signals, the first sub-word line driving signals and the second sub-word line driving signals having complementary logic levels relative to each other, and wherein the sub-word line driving signals comprise the first sub-word line driving signals and the second sub-word line driving signals.

2. The memory device of claim 1, wherein the sub-word line driver circuit comprises: first and second P-type metal-oxide-semiconductor (PMOS) transistors connected in series to lines of the first sub-word line driving signals, wherein each of the first main word line driving signals is connected to a gate of the first PMOS transistor, and each of the second main word line driving signals is connected to a gate of the second PMOS transistor; and first to third N-type metal-oxide-semiconductor (NMOS) transistors connected in parallel to a line of a negative voltage of the memory device, wherein each of the first main word line driving signals is connected to a gate of the first NMOS transistor, each of the second main word line driving signals is connected to a gate of the second NMOS transistor, and each of the second sub-word line driving signals is connected to a gate of the third NMOS transistor, wherein the NOR logic circuit comprises the first and second PMOS transistors and the first and second NMOS transistors, and the plurality of word lines are respectively connected to connection nodes between the second PMOS transistor and the first to third NMOS transistors.

3. The memory device of claim 1, wherein the first main word line driving signal generation circuit comprises a NAND logic circuit that is configured to decode the subset of signals of the most significant bit group from among the row address signals, to input each of decoded row address signals, and to output each of the first main word line driving signals, and wherein the NAND logic circuit is configured to be selectively connected to a line of a high voltage and a line of a ground voltage of the memory device.

4. The memory device of claim 1, wherein the second main word line driving signal generation circuit comprises a NAND logic circuit that is configured to decode the remaining signals of the most significant bit group from among the row address signals, to input each of decoded row address signals, and to output each of the second main word line driving signals, and wherein the NAND logic circuit is configured to be selectively connected to a line of a high voltage and a line of a ground voltage of the memory device.

5. The memory device of claim 1, wherein the first sub-word line driving signal generation circuit comprises a NAND logic circuit that is configured to decode the remaining signals of the least significant bit group from among the row address signals, to input each of decoded row address signals, and to output each of the first sub-word line driving signals, and wherein the NAND logic circuit is configured to be selectively connected to a line of a high voltage and a line of a ground voltage of the memory device.

6. The memory device of claim 1, wherein the second sub-word line driving signal generation circuit comprises a NAND logic circuit that is configured to decode the remaining signals of the least significant bit group from among the row address signals, to input each of decoded row address signals, and to output each of the second sub-word line driving signals, and wherein the NAND logic circuit is configured to be selectively connected to a line of a high voltage and a line of a ground voltage of the memory device.

7. A memory device, comprising:

a core peripheral circuit structure comprising a first bonding metal pad; and a cell array structure at least partially overlapping the core peripheral circuit structure in a vertical direction, perpendicular to an upper surface of the core peripheral circuit structure, and comprising a second bonding metal pad in electrical contact with the first bonding metal pad, wherein the cell array structure comprises a memory cell region including a plurality of memory blocks comprising a plurality of word lines, wherein each of the plurality of word lines electrically contacts the first bonding metal pads and the second bonding metal pads, respectively, the core peripheral circuit structure comprises a row decoder electrically connected to the plurality of word lines of each of the plurality of memory blocks, and the row decoder comprises:

a main word line driver circuit configured to generate first main word line driving signals, second main word line driving signals, and sub-word line driving signals based on row address signals; and a sub-word line driver circuit configured to activate one word line from among the plurality of word lines using a NOR logic circuit to which the first main word line driving signals, the second main word line driving signals, and the sub-word line driving signals are electrically connected, wherein the main word line driver circuit comprises:

- a first main word line driving signal generation circuit configured to generate the first main word line driving signals based on a first subset of signals of a most significant bit group from among the row address signals;
- a second main word line driving signal generation circuit configured to generate the second main word line driving signals based on a second subset of signals of a most significant bit group from among the row address signals, the second subset of signals of a most significant bit group are different from the first subset of signals of a most significant bit group; and
- a first sub-word line driving signal generation circuit and a second sub-word line driving signal generation circuit configured to generate first sub-word line driving signals and second sub-word line driving signals, respectively, based on remaining signals of a least significant bit group from among the row address signals.

8. The memory device of claim 7, wherein the main word line driver circuit is commonly electrically connected to the plurality of memory blocks.

9. The memory device of claim 7, wherein the sub-word line driver circuit is electrically connected to each of the plurality of memory blocks.

10. The memory device of claim 9, wherein the sub-word line driver circuit comprises:

first and second P-type metal-oxide-semiconductor (PMOS) transistors connected in series to lines of the first sub-word line driving signals, wherein each of the first main word line driving signals is connected to a gate of the first PMOS transistor, and each of the second main word line driving signal is connected to a gate of the second PMOS transistor;

first to third N-type metal oxide semiconductor (NMOS) transistors connected in parallel to a line of a negative voltage of the memory device, wherein each of the first main word line driving signals is connected to a gate of the first NMOS transistor, each of the second main word line driving signals is connected to a gate of the second NMOS transistor, and each of the second sub-word line driving signals is connected to a gate of the third NMOS transistor, the NOR logic circuit comprises the first and second PMOS transistors and the first and second NMOS transistors, and the plurality of word lines are respectively connected to connection nodes between the second PMOS transistor and the first to third NMOS transistors.

11. The memory device of claim 7, wherein the memory cell region comprises a plurality of bit lines extending in a second horizontal direction intersecting a first horizontal direction and parallel to the upper surface of the core peripheral circuit structure, and the memory device comprises a plurality of cell structures comprising a plurality of vertical channel transistor structures respectively on the plurality of bit lines and a plurality of capacitor structures respectively electrically connected to the plurality of vertical channel transistor structures.

12. The memory device of claim 11, wherein the memory cell region comprises a shielding bit line between and under the plurality of bit lines.

13. A memory device, comprising:

a core peripheral circuit structure comprising a first bonding metal pad; and a cell array structure at least partially overlapping the core peripheral circuit structure in a vertical direction, perpendicular to an upper surface of the core peripheral circuit structure, and comprising a second bonding metal pad in contact with the first bonding metal pad, wherein the cell array structure comprises a memory cell region including a plurality of memory blocks comprising a plurality of word lines, wherein each of the plurality of word lines electrically contacts the first bonding metal pads and the second bonding metal pads, respectively, the core peripheral circuit structure comprises a row decoder electrically connected to the plurality of word lines of each of the plurality of memory blocks, the row decoder comprises a sub-word line driver circuit configured to activate one word line from among the plurality of word lines, and the sub-word line driver circuit is in a region that at least partially overlaps the first bonding metal pad in the vertical direction.

14. The memory device of claim 13, wherein the row decoder further comprises:

a main word line driver circuit commonly connected to the plurality of memory blocks and configured to generate first main word line driving signals, second main word line driving signals, and sub-word line driving signals based on row address signals, wherein the sub-word line driver circuit is electrically connected to each of the plurality of memory blocks and is configured to activate the one word line from among the plurality of word lines based on the first main word line driving signals, the second main word line driving signals, and the sub-word line driving signals.

15. The memory device of claim 14, wherein the main word line driver circuit comprises:

a first main word line driving signal generation circuit configured to generate the first main word line driving signals based on a subset of signals of a most significant bit group from among the row address signals;

a second main word line driving signal generation circuit configured to generate the second main word line driving signals based on remaining signals, not included in the subset of signals, of the most significant bit group from among the row address signals; and a first sub-word line driving signal generation circuit and a second sub-word line driving signal generation circuit configured to generate first sub-word line driving signals and second sub-word line driving signals, respectively, based on remaining signals of a least significant bit group from among the row address signals, the first sub-word line driving signals and the second sub-word line driving signals having complementary logic levels relative to each other, and the sub-word line driving signals comprise the first sub-word line driving signals and the second sub-word line driving signals.

16. The memory device of claim 15, wherein the sub-word line driver circuit comprises:

first and second P-type metal-oxide-semiconductor (PMOS) transistors connected in series to lines of the first sub-word line driving signals, wherein each of the first main word line driving signals is connected to a gate of the first PMOS transistor, and each of the second main word line driving signals is connected to a gate of the second PMOS transistor; and first to third N-type metal-oxide-semiconductor (NMOS) transistors connected in parallel to a line of a negative voltage of the memory device, wherein each of the first main word line driving signals is connected to a gate of the first NMOS transistor, each of the second main word line driving signals is connected to a gate of the second NMOS transistor, and each of the second sub-word line driving signals is connected to a gate of the third NMOS transistor, wherein a NOR logic circuit comprises the first and second PMOS transistors and the first and second NMOS transistors, and the plurality of word lines are respectively connected to connection nodes between the second PMOS transistor and the first to third NMOS transistors.

17. The memory device of claim 13, wherein the memory cell region comprises a plurality of bit lines extending in a second horizontal direction intersecting a first horizontal direction, and the memory device comprises a plurality of cell structures comprising a plurality of vertical channel transistor structures respectively on the plurality of bit lines and a plurality of capacitor structures respectively electrically connected to the plurality of vertical channel transistor structures.

18. The memory device of claim 17, wherein the memory cell region comprises a shielding bit line between and under the plurality of bit lines.

19. The memory device of claim 7, wherein the first sub-word line driving signals and the second sub-word line driving signals having complementary logic levels relative to each other, and wherein the sub-word line driving signals comprise the first sub-word line driving signals and the second sub-word line driving signals.

* * * * *